United States Patent
Miyachi

(10) Patent No.: US 12,345,875 B2
(45) Date of Patent: Jul. 1, 2025

(54) OPTICAL SCANNING DEVICE WHICH DETECTS A DEFLECTION ANGLE OF A MIRROR UNIT BASED ON OUTPUTS FROM LIGHT DETECTORS

(71) Applicant: STANLEY ELECTRIC CO., LTD., Tokyo (JP)

(72) Inventor: Mamoru Miyachi, Tokyo (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 513 days.

(21) Appl. No.: 17/797,646

(22) PCT Filed: Jan. 29, 2021

(86) PCT No.: PCT/JP2021/003377
§ 371 (c)(1),
(2) Date: Aug. 4, 2022

(87) PCT Pub. No.: WO2021/161817
PCT Pub. Date: Aug. 19, 2021

(65) Prior Publication Data
US 2023/0097867 A1    Mar. 30, 2023

(30) Foreign Application Priority Data

Feb. 12, 2020 (JP) ................................. 2020-021646

(51) Int. Cl.
*G02B 26/08* (2006.01)
*G02B 26/12* (2006.01)

(52) U.S. Cl.
CPC ......... *G02B 26/0858* (2013.01); *G02B 26/12* (2013.01)

(58) Field of Classification Search
CPC .... G02B 26/0858; G02B 26/12; G02B 5/124; B81B 2203/0346; B81B 3/0083; B81B 2201/042; B81B 2203/058
See application file for complete search history.

(56) References Cited

U.S. PATENT DOCUMENTS 6,961,174 B1 * 11/2005 Weidmann ......... G01D 5/34707
250/237 G
9,097,895 B2   8/2015 Ikegami
(Continued)

FOREIGN PATENT DOCUMENTS

EP    1536626 A1   6/2005
EP    2975447 A1   1/2016
(Continued)

OTHER PUBLICATIONS

Extended European Search Report (EESR) dated May 19, 2023, issued in counterpart European Application No. 21753864.4.
(Continued)

*Primary Examiner* — Michelle M Iacoletti
*Assistant Examiner* — Sebastian A Arnez
(74) *Attorney, Agent, or Firm* — Holtz, Holtz & Volek PC

(57) ABSTRACT

An optical scanning device includes a control unit, a light deflector, light detection units, and a light source. A mirror unit of the light deflector has a flat reflection part for generating scanning light and a groove-shaped reflection part for generating twice reflected light, and performs reciprocating rotation about a rotation axis. The light detection units are disposed at positions on the scanning trajectory of the scanning light where the twice reflected light is received, and are each divided into light detectors in the scanning direction of the scanning light by a division line. The control
(Continued)

unit detects the deflection angle θ of the mirror unit based on both the output of the light detector and the output of the light detector.

18 Claims, 17 Drawing Sheets

(56) References Cited

U.S. PATENT DOCUMENTS

| | | | |
|---|---|---|---|
| 11,314,079 B2 | 4/2022 | Miyachi | |
| 2002/0075786 A1 | 6/2002 | Ikegame | |
| 2005/0111010 A1 | 5/2005 | Kellie et al. | |
| 2006/0175544 A1 | 8/2006 | Nozaki et al. | |
| 2015/0116446 A1* | 4/2015 | Toyota | G02B 26/105 |
| | | | 347/256 |
| 2016/0011311 A1 | 1/2016 | Mushimoto et al. | |
| 2018/0314059 A1* | 11/2018 | Yamada | G02B 26/127 |

FOREIGN PATENT DOCUMENTS

| | | |
|---|---|---|
| JP | S5571345 U | 5/1980 |
| JP | 2006243225 A | 9/2006 |
| JP | 2011118178 A | 6/2011 |
| JP | 2014056020 A | 3/2014 |

OTHER PUBLICATIONS

International Search Report (ISR) (and English translation thereof) dated Apr. 20, 2021, issued in International Application No. PCT/JP2021/003377.

Written Opinion dated Apr. 20, 2021, issued in International Application No. PCT/JP2021/003377.

* cited by examiner

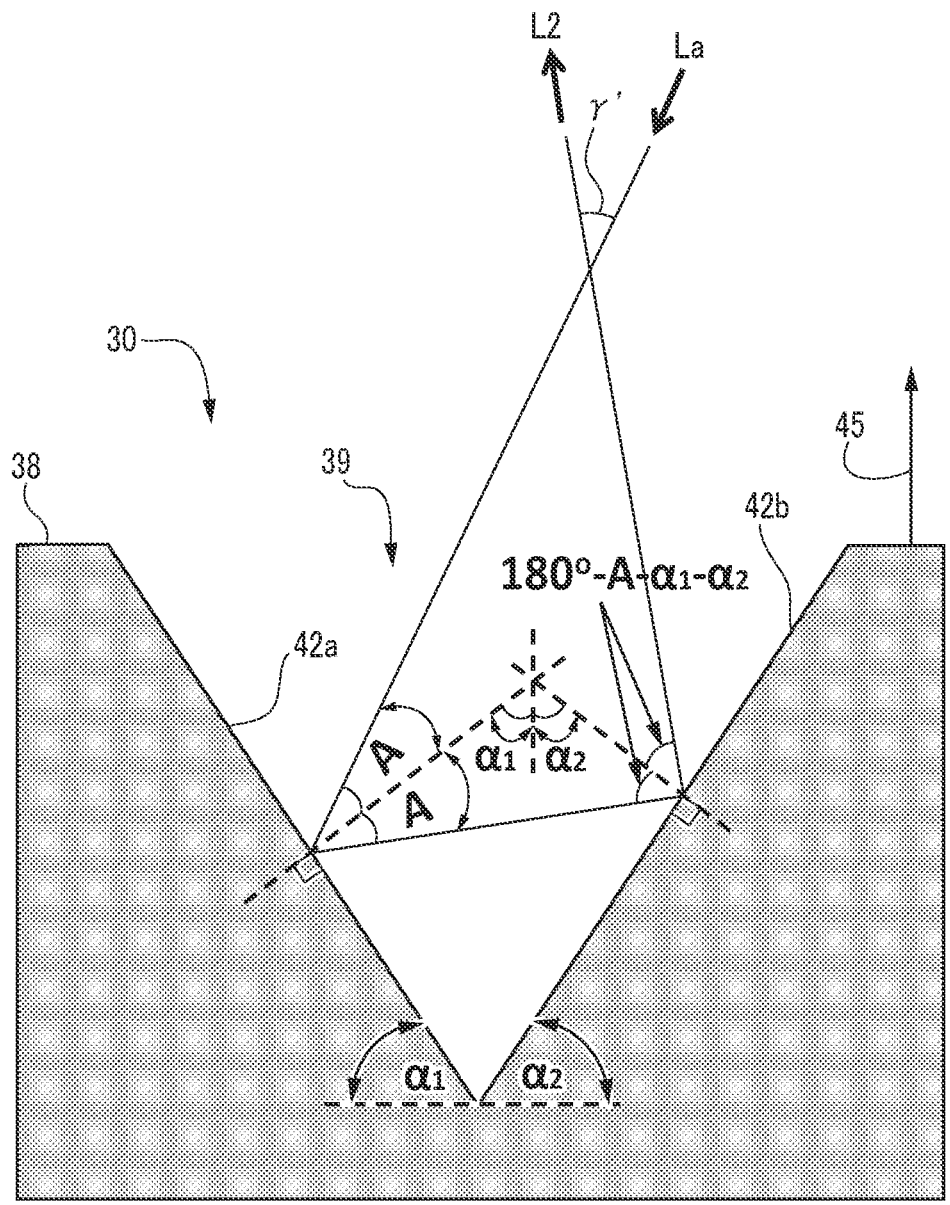

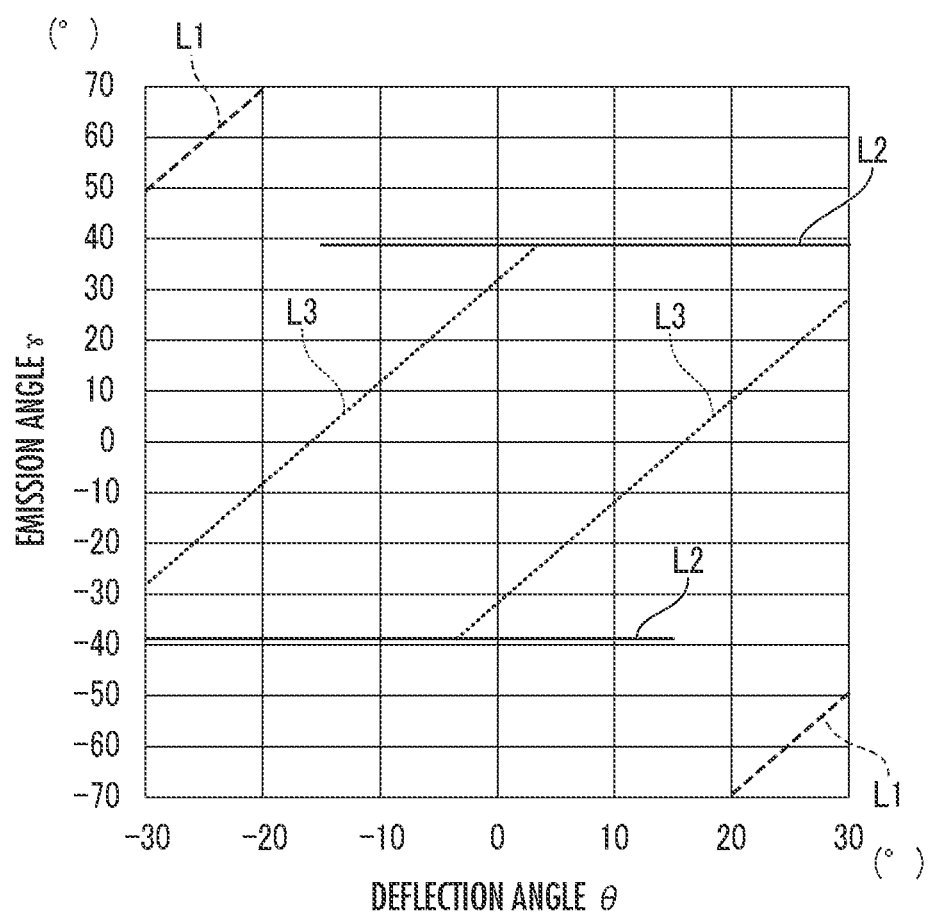

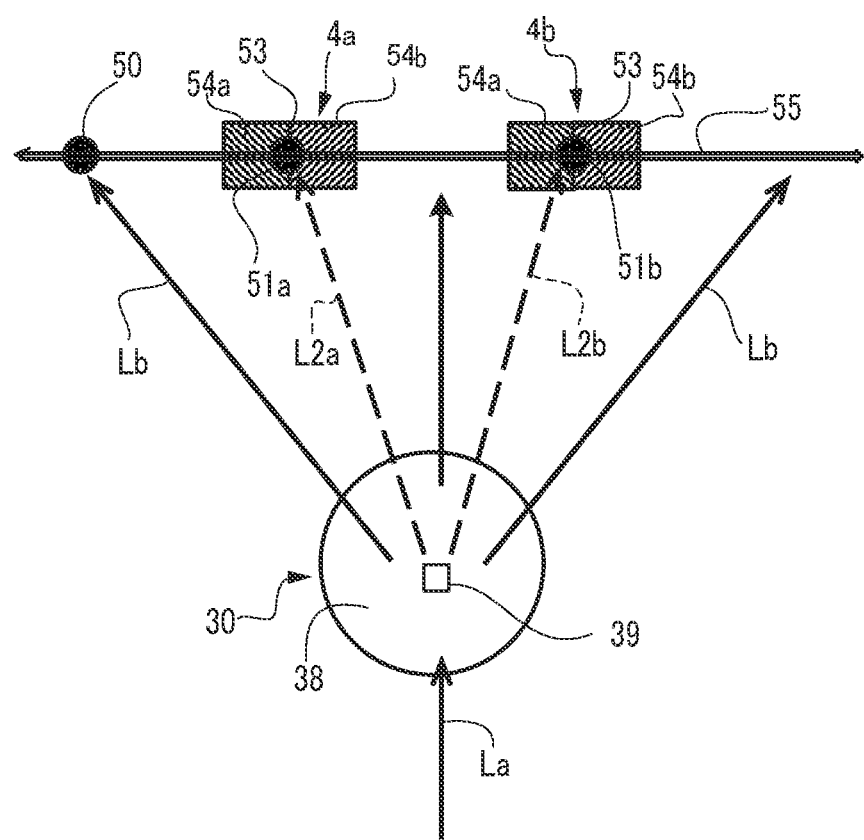

OPTICAL SCANNING DEVICE WHICH DETECTS A DEFLECTION ANGLE OF A MIRROR UNIT BASED ON OUTPUTS FROM LIGHT DETECTORS

TECHNICAL FIELD

The present invention relates to an optical scanning device provided with a light deflector.

BACKGROUND ART

There has been known a MEMS (Micro Electro Mechanical Systems) light deflector and an optical scanning device provided therewith (e.g., Patent Literatures 1 and 2). The MEMS light deflector includes a mirror unit, which performs reciprocating rotation about a rotation axis, reflects light from a light source in a direction based on the deflection angle of the mirror unit, and emits the reflected light as scanning light.

The scanning position of scanning light in an irradiation region changes according to the deflection angle of the mirror unit. Therefore, it is necessary to detect the deflection angle of the mirror unit in order to properly control the irradiation quality of the scanning light.

The optical scanning device of Patent Literature 1 includes a PD (photodiode) disposed in the emission direction of reflected light when the mirror unit reaches an end of a deflection angle range. Thus, when the mirror unit reaches a predetermined deflection angle at the end of the deflection angle range, the reflected light is detected by the PD.

In the optical scanning device of Patent Literature 2, the reflection surface of a mirror unit is formed of a diffraction grating. In the optical scanning device, the zero-order diffracted light emitted from the mirror unit is used for the intended scanning light. On the other hand, the first-order diffracted light enters a light receiving element and is used for detecting a deflection angle.

CITATION LIST

Patent Literatures

Patent Literature 1: Japanese Patent Application Laid-Open No. 2006-243225
Patent Literature 2: Japanese Patent Application Laid-Open No. 2011-118178

SUMMARY OF INVENTION

Technical Problem

In the optical scanning devices of Patent Literatures 1 and 2, errors occur in the detection of the deflection angle of the mirror unit due to variations in the mounting position and characteristics of the PD that detects reflected light and diffracted light.

An object of the present invention is to provide an optical scanning device capable of compensating for the variations in the mounting position and the characteristics of a light detection unit when detecting the deflection angle of a mirror unit.

Solution to Problem

An optical scanning device in accordance with the present invention includes:
a light source which emits light;
a light deflector having a mirror unit which includes: on a front surface side, a flat reflection part that emits incident light entering from the light source as scanning reflection light, and a groove-shaped reflection part having a longitudinal groove that extends in a predetermined direction and has a pair of inclined surfaces facing each other such that a groove width decreases from the front surface side to a back surface side, and which reflects the incident light a total of twice, once on each inclined surface and emits the reflected incident light as index light; and a first actuator that rotates the mirror unit in a reciprocating manner about a first rotation axis parallel to an extending direction of the longitudinal groove;
a light detection unit which is disposed on a scanning trajectory of a scanning light spot of the scanning reflection light and at a light reception position of an index light spot of the index light, and is divided into a first light detector and a second light detector by a division line that divides the index light spot in a scanning direction of the scanning reflection light; and
a deflection angle detection unit which detects a first deflection angle as a deflection angle of the mirror unit about the first rotation axis based on comparison between an output of the first light detector and an output of the second light detector.

According to the present invention, the first and the second light detectors are disposed on the scanning trajectory of a scanning light spot, and receive each portion of an index light spot divided by the division line. Further, the deflection angle of the mirror unit is detected based on the output of the first light detector and the output of the second light detector. The variations in the mounting position and characteristics of the light detection unit are reflected on the relationship between the output of the first light detector and the output of the second light detector, thus making it possible to compensate for the variations when detecting the deflection angle of the mirror unit.

Preferably, in the optical scanning device in accordance with the present invention,
the deflection angle detection unit performs the comparison between an output of the first light detector and an output of the second light detector based on a difference between the two outputs.

According to the configuration, a first deflection angle is detected based on the difference between the output of the first and the output of the second light detector. This makes it possible to improve the accuracy of detecting the deflection angle of the mirror unit.

Preferably, in the optical scanning device in accordance with the present invention,
the deflection angle detection unit performs comparison of an output of the first light detector and an output of the second light detector based on a ratio of the two outputs.

According to the configuration, a first deflection angle is detected based on the ratio between the output of the first light detector and the output of the second light detector. This makes it possible to improve the accuracy of detecting the deflection angle of the mirror unit.

Preferably, in the optical scanning device in accordance with the present invention, the deflection angle detection unit uses a deflection angle of the mirror unit associated with a traveling direction of the index light as an index deflection angle, and detects that a deflection angle of the mirror unit about the first rotation axis has reached the index deflection angle based on an output of the first light detector and an output of the second light detector.

According to the configuration, it is detected that the deflection angle of the mirror unit has reached an index deflection angle based on the output of the first light detector and the output of the second light detector. This makes it possible to improve the accuracy of detecting the deflection angle of the mirror unit.

Preferably, in the optical scanning device in accordance with the present invention, the deflection angle detection unit generates an intermediate value based on comparison of an output of the first light detector and an output of the second light detector, uses an intermediate value obtained in the case where the scanning light spot is not received as a reference value, and detects the first deflection angle based on a calibrated value obtained by calibrating the intermediate value by the reference value.

According to the configuration, an intermediate value obtained when a scanning light spot is not received is used as a reference value, and a deflection angle is detected based on a calibrated value obtained by calibrating the intermediate value by the reference value. This makes it possible to prevent variations in detected deflection angles from one optical scanning device to another.

Preferably, in the optical scanning device in accordance with the present invention, the deflection angle detection unit uses, as an index deflection angle, a deflection angle of the mirror unit associated with a traveling direction of the index light, and detects a timing at which a deflection angle of the mirror unit becomes the index deflection angle based on a timing at which a sign of the difference is reversed.

According to the configuration, the timing at which the mirror unit has reached an index deflection angle is detected based on the timing at which the sign of a difference is reversed. This makes it possible to detect a versatile timing.

Preferably, in the optical scanning device in accordance with the present invention, the intermediate value is a normalized difference Ev defined by Formula 1, which will be discussed later.

According to the configuration, the first deflection angle is detected using the normalized difference Ev, thus making it possible to use a versatile optical scanning device regardless of the type of optical scanning device.

Preferably, in the optical scanning device in accordance with the present invention, the light detection unit is provided as one and the other light detection units, one on each side, with respect to a center of a deflection angle range of the scanning light spot, and the deflection angle detection unit detects an angle range of the deflection angle of the scanning light spot based on a time difference between a sign inversion timing in the one light detection unit and a sign inversion timing in the other light detection unit.

The interval between the two light detection units is fixed. This configuration makes it possible to smoothly detect the angle range of a deflection angle by detecting the time difference.

Preferably, in the optical scanning device in accordance with the present invention, the pair of inclined surfaces are formed symmetrically with respect to a vertical plane perpendicular to a flat reflection surface of the flat reflection part.

According to the configuration, a light receiving intensity of an index light spot in a light detection unit can be increased.

Preferably, in the optical scanning device in accordance with the present invention, in the case where a tilt angle of the inclined surfaces of the longitudinal groove with respect to the flat reflection surface is denoted by $\alpha$, $2\cdot\alpha$ is within a range of 80° to 120°.

According to the configuration, the light receiving intensity of an index light spot in the light detection unit can be increased.

Preferably, in the optical scanning device in accordance with the present invention, the mirror unit has the flat reflection surface and the groove-shaped reflection surface on a front surface of a common substrate layer composed of a silicon crystal layer, and Miller indices of a main surface of the crystal layer and an inclined surface of the longitudinal groove are one and the other of (100) and (111), respectively.

According to the configuration, the inclined surfaces of the groove-shaped reflection part can be smoothly formed to have desired tilt angles by using the Miller index of the silicon crystal surface.

Preferably, in the optical scanning device in accordance with the present invention, the longitudinal groove is open at least partly on the back surface side.

According to the configuration, the accuracy of detecting the deflection angle of the mirror unit can be enhanced by preventing thrice reflected light from entering the light detection unit.

Preferably, in the optical scanning device in accordance with the present invention, in the case where the longitudinal groove is a V-groove, which opens on the front surface side of the mirror unit, and an inclined surface of the V-groove is divided into a front surface side inclined surface portion and a back surface side inclined surface portion by a division plane parallel to the flat reflection surface, an inclined surface of the longitudinal groove is formed of the front surface side inclined surface portion, and in the case where a length of the front surface side inclined surface portion and a length of the back surface side inclined surface portion in a cross section of the V-groove are denoted by Da and Db, respectively, and a tilt angle of the inclined surface of the longitudinal groove with respect to the flat reflection surface is denoted by $\alpha$, the following applies:

$$Da:Db=|\tan(2\cdot\alpha)|:|\tan(\alpha)|$$

According to the configuration, the length of the inclined surface for preventing thrice reflected light from entering the light detection unit can be appropriately determined.

Preferably, in the optical scanning device in accordance with the present invention, the groove-shaped reflection part is disposed in such a manner as to overlap the first rotation axis in a front view of the mirror unit.

According to the configuration, a deflection angle can be detected without hindrance when the mirror unit swings to either side with respect to the front view of the light deflector.

Preferably, in the optical scanning device in accordance with the present invention, the groove-shaped reflection part occupies a central part of the mirror unit.

According to the configuration, the intensity of an index light spot can be increased as the intensity of light incident on the groove-shaped reflection part increases.

Preferably, in the optical scanning device in accordance with the present invention, the light deflector includes a second actuator that rotates the mirror unit about a second rotation axis orthogonal to the first rotation axis in a reciprocating manner, and the light detection unit is formed in a long narrow shape in a scanning direction of the index light spot at the time of reciprocating rotation of the mirror unit about the second rotation axis.

According to the configuration, the light detection unit is formed in a long narrow shape in a scanning direction of the index light spot at the time of reciprocating rotation of the mirror unit about the second rotation axis. This enables a light deflector, which two-dimensionally scans a scanning light spot, to detect a first deflection angle without hindrance.

Preferably, in the optical scanning device in accordance with the present invention, the groove-shaped reflection part has a plurality of the longitudinal grooves.

According to the configuration, the light receiving intensity of an index light spot in a light detection unit can be increased by providing a plurality of longitudinal grooves.

Preferably, in the optical scanning device in accordance with the present invention, a pitch Dp of the plurality of longitudinal grooves is set according to Formula 2, which will be described later.

According to the configuration, a light detection unit is at a position where enhancement takes place by the mutual interference of index light spots from the longitudinal grooves. This makes it possible to increase the intensity of an index light spot received by the light detection unit.

BRIEF DESCRIPTION OF DRAWINGS

FIG. 4 is an explanatory diagram of twice reflected light;

FIG. 5 is a graph illustrating the relationship between the deflection angle of the mirror unit and the emission angle of each reflected light from a light deflector;

FIG. 9 is a schematic diagram illustrating the relationship between a scanning light spot and index light spots and the light detection units;

DESCRIPTION OF EMBODIMENTS

Figure 1:
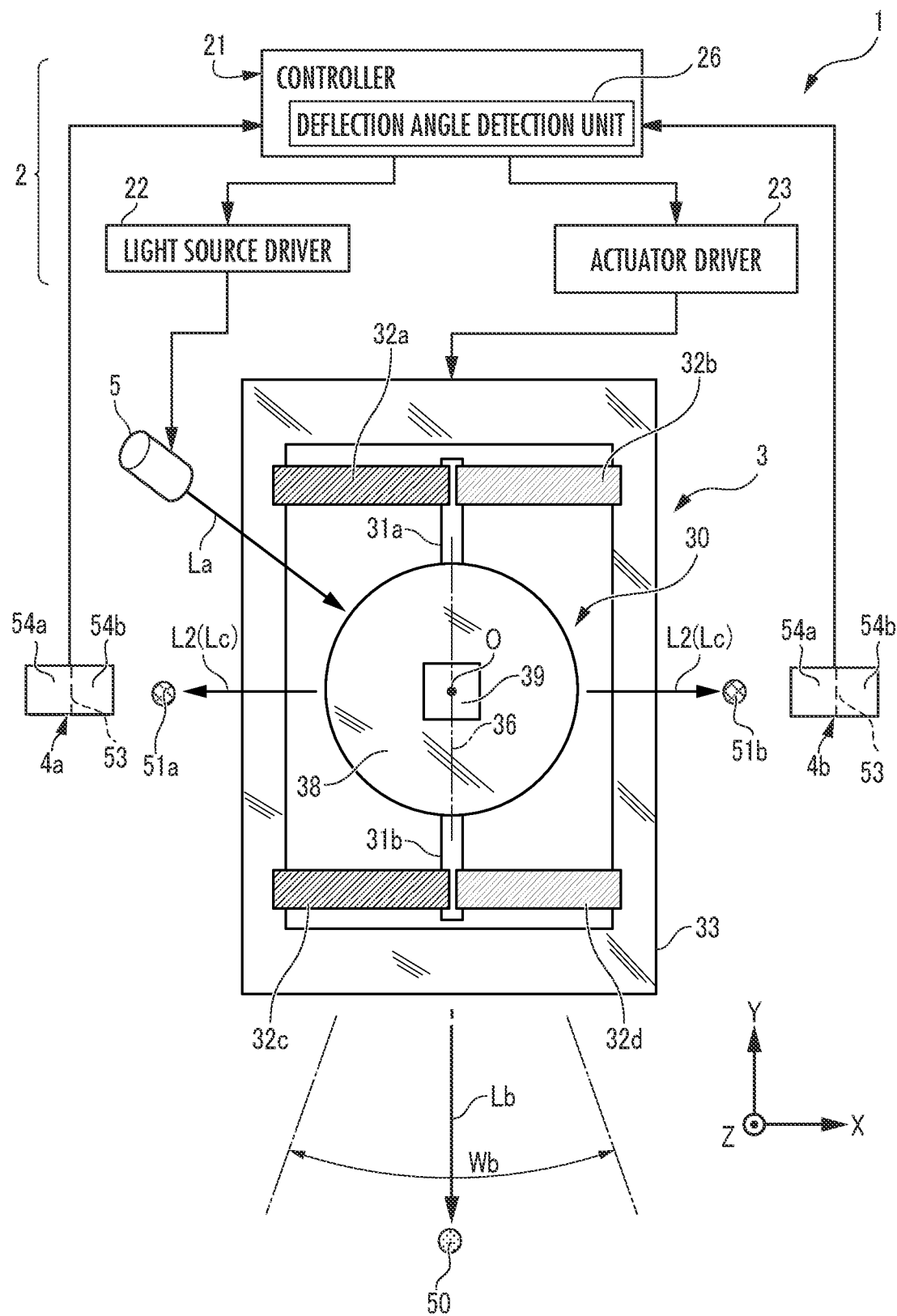
FIG. 1 is a configuration diagram of a single-axis (one-dimensional) scanning type optical scanning device.

A plurality of preferred embodiments of the present invention will be described in detail with reference to the accompanying drawings. It is needless to say that the present invention is not limited to the following embodiments. The present invention includes a variety of configuration modes within the scope of the technical concept of the present invention in addition to the following embodiments.

In the illustrated embodiments, the same reference numerals are used for the same components. In each embodiment, the reference numerals of a pair of components have the same numbers with different subscript letters. When elements of reference numerals with letters are collectively referred to, reference numerals of only numbers without letters are used.

(Single-Axis Scanning Type Optical Scanning Device)

FIG. 1 is a configuration diagram of a single-axis (one-dimensional) scanning type optical scanning device 1. As a single-axis scanning type optical scanning device, the optical scanning device 1 includes a single-axis scanning type light deflector 3. The optical scanning device 1 includes a control unit 2, light detection units 4a and 4b, and a light source 5 in addition to the light deflector 3.

The light source 5 is, for example, a laser light source. The light source 5 emits original light La as original light. The original light La enters the front surface of a mirror unit 30 as the incident light of the light deflector 3. In this example, the front surface of the circular mirror unit 30 is composed of a flat reflection part 38, which constitutes the majority thereof, and a groove-shaped reflection part 39 disposed at a center O of the mirror unit 30.

The reflection surface of the flat reflection part 38 is formed of a flat plane as a flat reflection surface. On the other hand, the groove-shaped reflection part 39 has a V-groove-shaped reflection surface.

Of the original light La, the light incident on the flat reflection part 38 turns into scanning light Lb, which is then emitted from the flat reflection part 38. Of the original light La, the light incident on the groove-shaped reflection part 39 turns into detection light Lc, which is then emitted from the groove-shaped reflection part 39. The detection light Lc includes once reflected light L1, twice reflected light L2, and thrice reflected light L3. The once reflected light L1, the twice reflected light L2, and the thrice reflected light L3 will be described in detail with reference to FIG. 3.

The control unit 2 includes a controller 21, a light source driver 22, and an actuator driver 23. The controller 21 further includes a deflection angle detection unit 26.

The light source driver 22 and the actuator driver 23 drive the light source 5 and a piezoelectric actuator 32 of the light deflector 3, respectively. The light source 5 is driven by the light source driver 22 and controlled to be turned on and off, and the luminous intensity thereof is also controlled at the time of lighting. The piezoelectric actuator 32 of the light deflector 3 controls the reciprocating rotation of the mirror unit 30 about a rotation axis 36 by being driven by the actuator driver 23.

The deflection angle detection unit 26 detects a deflection angle θ (FIG. 3) of the mirror unit 30 of the light deflector 3 based on a detection signal from each light detection unit 4. The controller 21 drives the light source 5 and the piezoelectric actuator 32 while synchronizing these two with each other based on the deflection angle θ.

The single-axis scanning type light deflector 3 is the same as a known single-axis piezoelectric type light deflector (e.g., Japanese Unexamined Patent Application Publication No. 2014-056020) except for the mirror unit 30. Therefore, the light deflector 3 will be briefly described. For convenience of explaining the configuration of the light deflector 3, a three-axis Cartesian coordinate system of X-axis, Y-axis, and Z-axis will be defined.

The rotation axis 36 passes through the center O of the mirror unit 30 and extends in a Y-axis direction. Torsion bars 31a and 31b extend from the sides of the mirror unit 30 along the rotation axis 36. Piezoelectric actuators 32a to 32d all extend in an X-axis direction. The piezoelectric actuators 32a and 32b are provided on both sides of the torsion bar 31a in the X-axis direction, and interposed between the torsion bar 31a and a support frame 33. The piezoelectric actuators 32c and 32d are provided on both sides of the torsion bar 31b in the X-axis direction, and interposed between the torsion bar 31b and the support frame 33.

The dimensions of the sections of the mirror unit 30 are, for example, as follows. The mirror unit 30 has a circular shape of 1 mmφ to 2 mmφ. The groove-shaped reflection part 39 has a square shape, one side of which measures several 10 μm to several 100 μm.

The piezoelectric actuator 32 rotates the part thereof coupled with the torsion bar 31 about the rotation axis 36 in a reciprocating manner. This causes the torsional vibration of the torsion bar 31 to be transmitted to the mirror unit 30, and the mirror unit 30 rotates about the rotation axis 36 at a predetermined resonant frequency. As a result, the scanning light Lb is displaced in a reciprocating manner with a deflection width (deflection angle range) Wb.

The scanning light Lb and the twice reflected light L2 (the detection light Lc) illustrated in FIG. 1 will be described in detail with reference to the next FIG. 2 to FIG. 4. A scanning light spot 50 is a light spot generated at an irradiation destination by the scanning light Lb generated by the original light La reflected on the flat reflection part 38. Index light spots 51a and 51b are light spots generated at an irradiation destination by the twice reflected light L2 of the detection light Lc generated by the original light La reflected on the groove-shaped reflection part 39. The scanning light spot 50 and the index light spots 51a and 51b will be described in detail with reference to FIG. 8 and after.

(Index Light)

Figure 2:
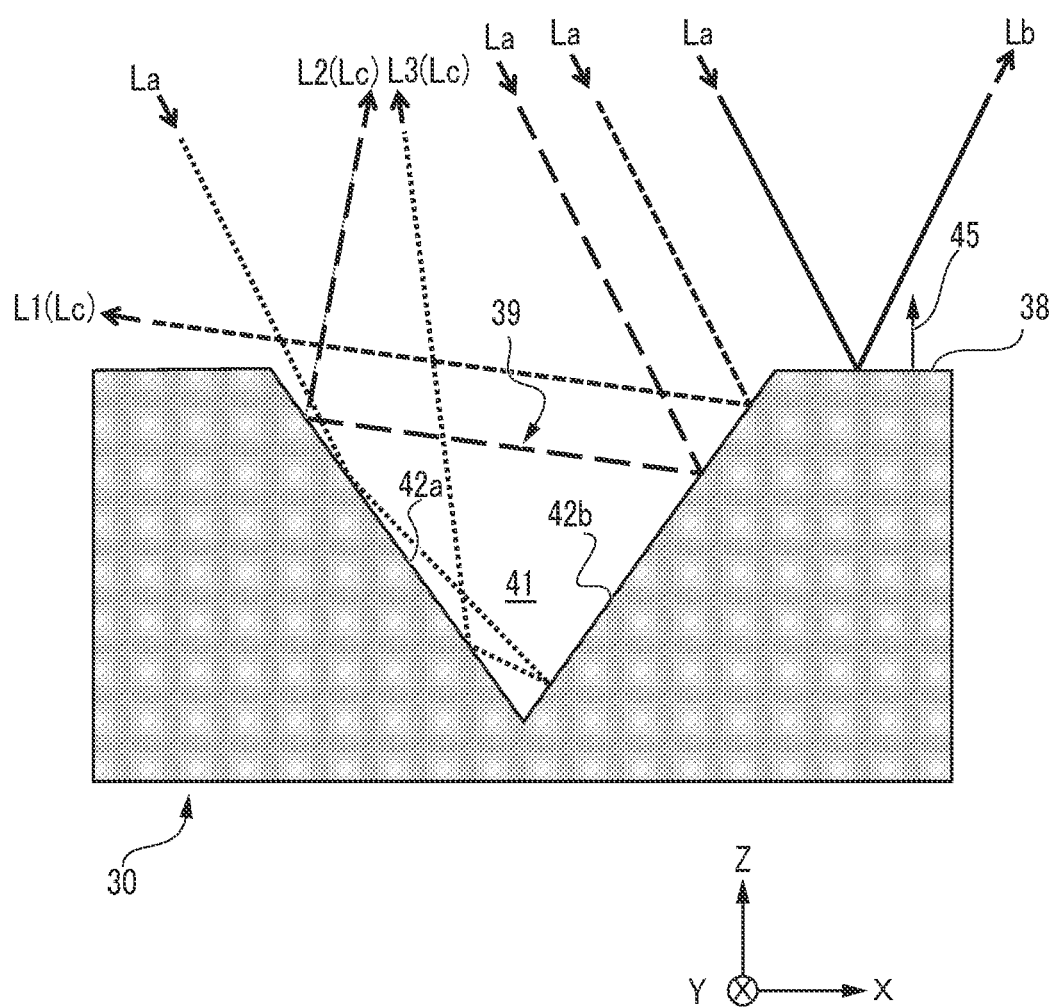
FIG. 2 is a cross-sectional diagram illustrating a groove-shaped reflection part cut by a plane which passes through the center of a mirror unit and which is perpendicular to a rotation axis.

FIG. 2 is a cross-sectional view illustrating the groove-shaped reflection part 39 cut by a plane which passes through the center O of the mirror unit 30 and which is perpendicular to the rotation axis 36. The deflection angle θ of the mirror unit 30 illustrated in FIG. 2 is 0°. In this embodiment, the deflection angle θ is defined as 0° when a normal 45 of the flat reflection part 38 is parallel to the Z-axis. In FIG. 2, the negative side of the Z-axis is the front surface side of the mirror unit 30, and the positive side of the Z-axis is the back surface side of the mirror unit 30.

The reflected light emitted from the mirror unit 30 comes in the scanning light Lb and the detection light Lc. The detection light Lc includes the once reflected light L1, the twice reflected light L2, and the thrice reflected light L3.

The groove-shaped reflection part 39 has one longitudinal groove 41 that extends in parallel to the Y-axis. The longitudinal groove 41 is illustrated in the cross-sectional view of FIG. 2. The longitudinal groove 41 is formed of a V-groove having a pair of inclined surfaces 42a and 42b facing each other such that the groove width decreases toward the bottom.

Figure 3:
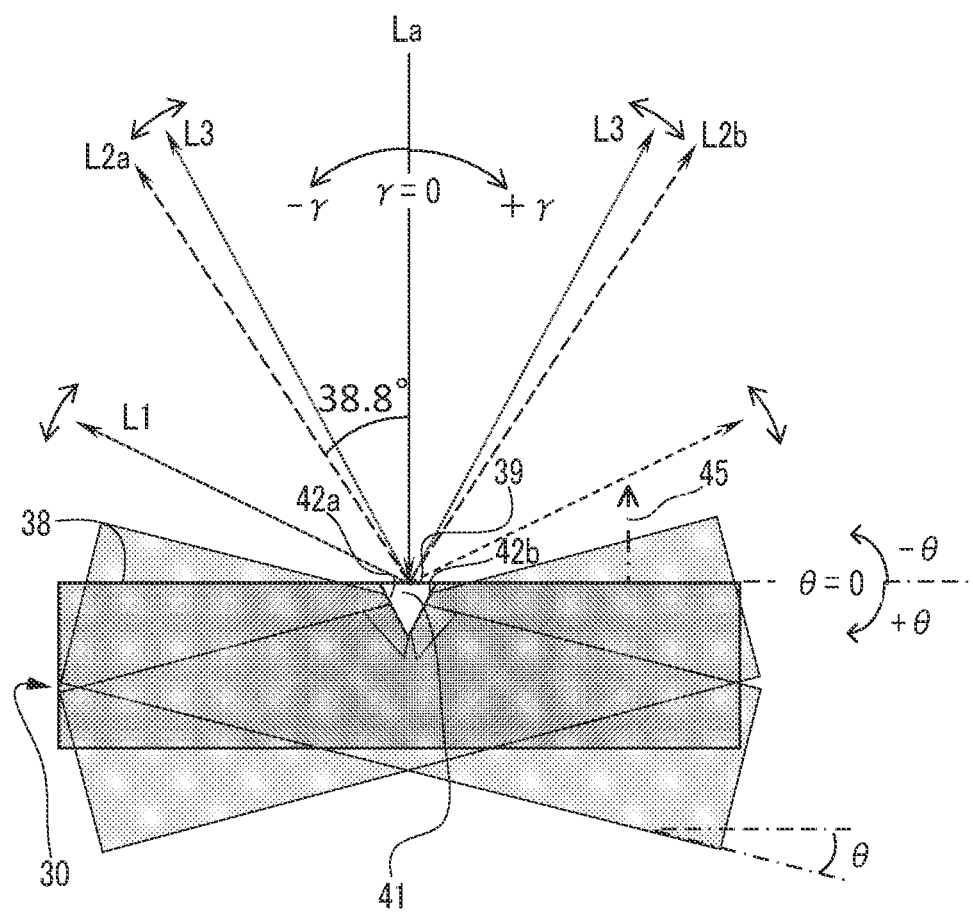
FIG. 3 is an explanatory diagram illustrating the relationship between the deflection angle of the mirror unit and the emission direction of each detection light.

FIG. 3 is an explanatory diagram illustrating the relationship between the deflection angle θ of the mirror unit 30 and the emission direction of each detection light Lc. In FIG. 3, it is assumed that the original light La is incident on the center O of the mirror unit 30 from the direction of the deflection angle θ=−90°. The normal 45 extends vertically with respect to the flat reflection surface of the flat reflection part 38.

An emission angle γ will be defined with respect to the emission directions of the scanning light Lb and the detection light Lc from the mirror unit 30. The emission angle γ is defined as the emission direction of reflected light with respect to the positive direction of the Z-axis. In FIG. 3, the original light La travels in parallel to the Z-axis and toward the negative side from the positive side of the Z-axis, so that the emission angle γ becomes an angle in the direction of emission from the mirror unit 30 with respect to the original light La having a reversed direction. Regarding the sign of the emission angle γ, the positive side and the negative side of the X-axis are defined as positive and negative, respectively.

The emission angles γ of the once reflected light L1 and the thrice reflected light L3 change according to the deflection angle θ. On the other hand, the emission angle γ of the twice reflected light L2 is fixed independently of the deflection angle θ. In FIG. 2, the emission angle γ of the twice reflected light L2 is ±38.8°.

FIG. 4 is an explanatory diagram of the twice reflected light L2. Symbols α1 and α2 denote the tilt angles of the inclined surfaces 42a and 42b with respect to the flat reflection surface of the flat reflection part 38. The tilt angle α refers to the tilt angles of the inclined surfaces 42a and 42b with respect to a plane parallel to the flat reflection part 38. In the illustrated embodiment, α1=α2=54.7°. The original light La is incident on the groove-shaped reflection part 39 from a predetermined direction.

A symbol γ' denotes the intersection angle between the original light La and the twice reflected light L2. An incident angle A of the original light La with respect to the inclined surface 42a changes according to the deflection angle θ. The sum of the interior angles of a triangle is 180°, so that γ'+2·A+2·(180°−A−α1−α2)=180° holds. As a result, γ' takes the fixed value of γ'=2·α1+2·α2−180° regardless of the deflection angle θ of the mirror unit 30. Therefore, if the incident direction of the original light La is set to the direction parallel to the Z-axis, then γ'=γ applies, and the emission angle γ of the twice reflected light L2 takes a fixed value regardless of the deflection angle θ. If α1=α2=54.7°, then the emission angle γ of the twice reflected light L2 takes the fixed value of ±38.8°.

As will be described later with reference to FIG. 8 and after, the twice reflected light L2 becomes the index light for detecting the deflection angle θ of the mirror unit 30. Therefore, the emission angle γ of the twice reflected light L2 is referred to especially as "the index angle."

The reason for setting the emission direction of the twice reflected light L2 to 38.8° is as follows. The reason is connected to the crystal orientation of the silicon of a wafer for manufacturing the light deflector 3 and a light deflector 103, which will be described later. More specifically, α1=α2=α=54.7° can be easily obtained by using the crystal orientation of silicon.

More specifically, when manufacturing the light deflector 3 from a silicon substrate, the Miller index of a main surface is (100) in a typical silicon substrate. On the other hand, the silicon crystal has crystal planes at (100) and (111), and the intersection angle between (100) and (111) is 54.7°. Therefore, if the front surface of a silicon substrate is processed by anisotropic etching, then the longitudinal groove 41 having the inclined surface 42 of the tilt angle α=54.7° can be easily manufactured.

In detail, the (111) planes of the inclined surfaces 42a and 42b can be selectively formed by using an alkaline aqueous solution such as KOH (potassium hydroxide), TMAH (tetramethylammonium hydroxide), or EDP (ethylene diaminepyrocatechol) as an etchant in the case of anisotropic etching. In the case where a silicon substrate having a main surface of (100) is used, a stable α of 54.7° can be obtained as an intersection angle between the (100) plane and the (111) plane.

FIG. 5 is a graph illustrating the relationship between the deflection angle θ of the mirror unit 30 and the emission angle γ of each of the reflected lights L1 to L3 from the light deflector 3. In FIG. 5, α1=α2=54.7° applies.

From FIG. 5, the emission angles γ of the once reflected light L1 and the thrice reflected light L3 change according to the deflection angle θ. On the other hand, it can be seen that the emission angle γ of the twice reflected light L2 is fixed to approximately 38.8° in absolute value for both the twice reflected light L2 on the negative side and the twice reflected light L2 on the positive side.

Figure 6A:
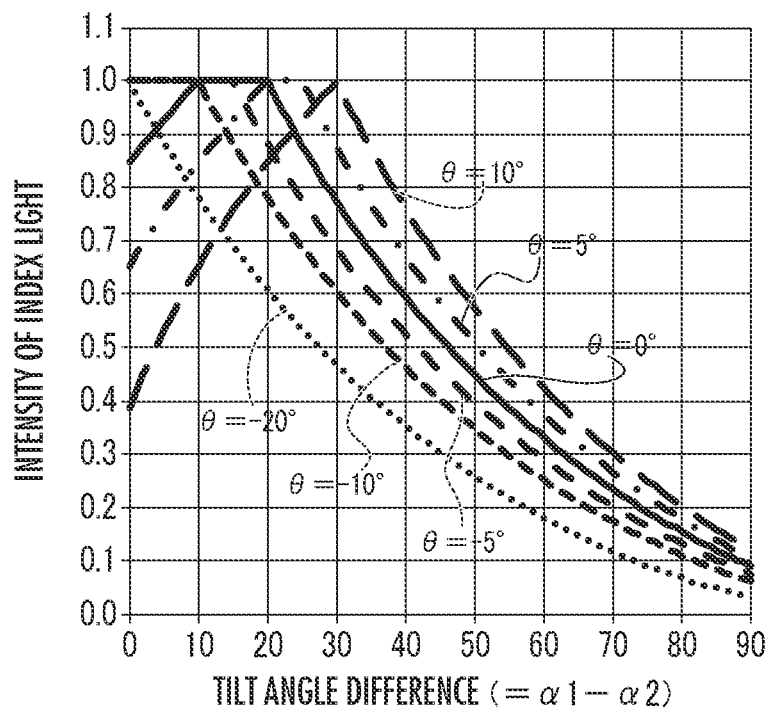
FIG. 6A is a graph illustrating the relationship, at various deflection angles, between the intensity of an index light spot in one light detection unit and the difference in tilt angle of an inclined surface.
Figure 6B:
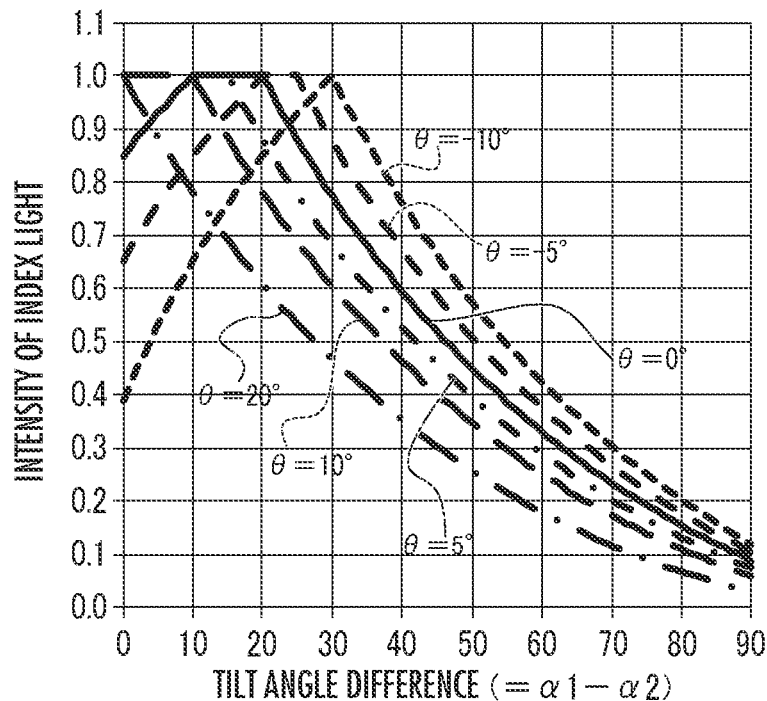
FIG. 6B is a graph illustrating the relationship, at various deflection angles, between the intensity of an index light spot in the other light detection unit and the difference in tilt angle of an inclined surface.

FIG. 6A and FIG. 6B are graphs illustrating the relationship at various deflection angles θ between the intensities of the index light spots 51a and 51b in the light detection unit 4a, which is one light detection unit, and the light detection unit 4b, which is the other light detection unit, respectively, and the tilt angle difference between the inclined surfaces 42a and 42b (=α1−α2). The intensity scale of the index light (twice reflected light L2) on the vertical axis shows relative values.

From FIG. 6A and FIG. 6B, it can be seen that the relative intensity of the twice reflected light L2 over the entire deflection width of the mirror unit 30 can be increased when the tilt angle difference is 0°.

Figure 7A:
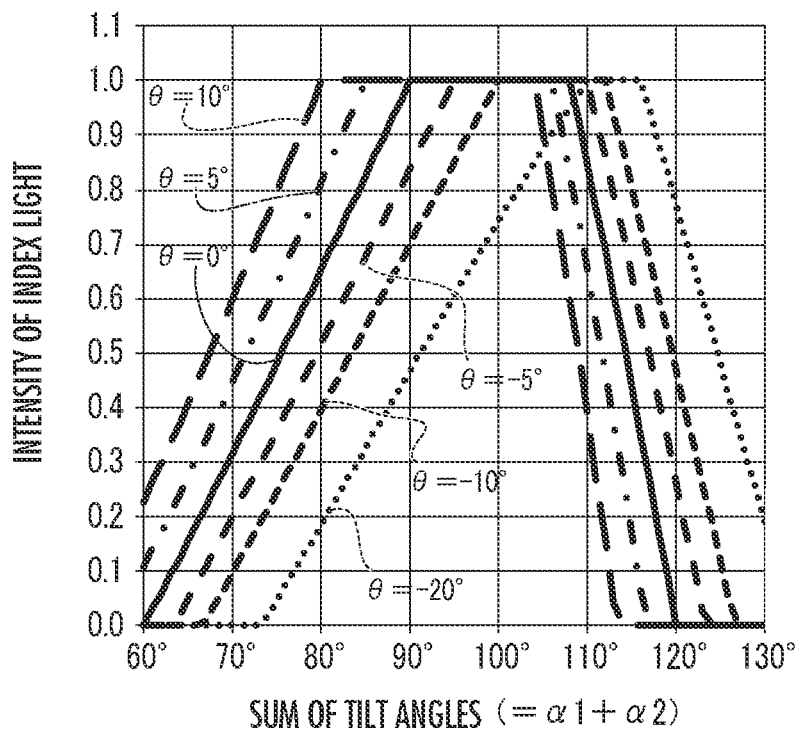
FIG. 7A is a graph illustrating the relationship, at various deflection angles, between the total of inclined angles of inclined surfaces and the intensity of index light in one light detection unit.
Figure 7B:
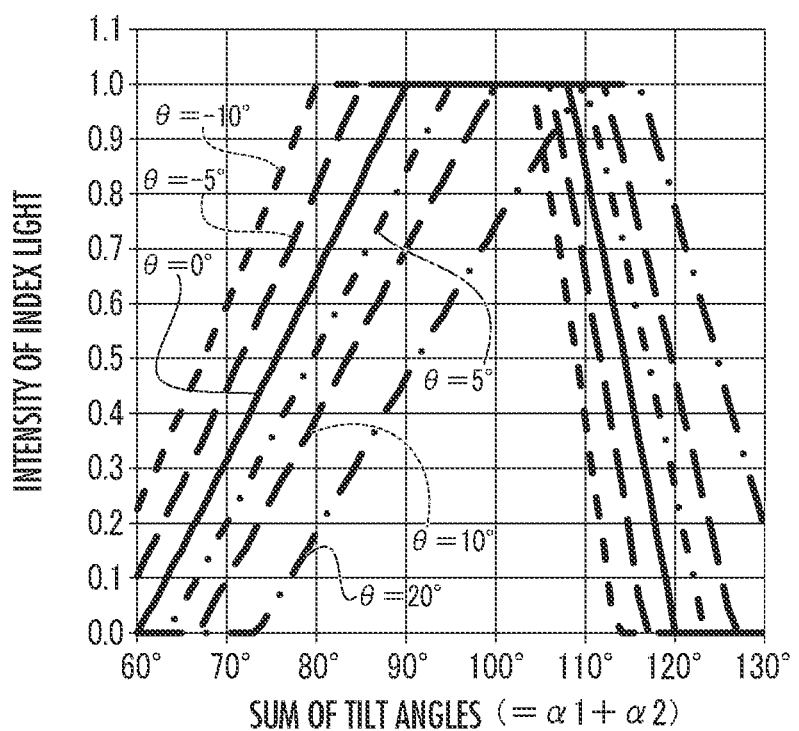
FIG. 7B is a graph illustrating the relationship, at various deflection angles, between the total of inclined angles of inclined surfaces and the intensity of index light in the other light detection unit.

FIG. 7A and FIG. 7B are graphs illustrating the relationship at various deflection angles θ between the tilt angle sum of the tilt angle α1 of the inclined surface 42a and the tilt angle α2 of the inclined surface 42b (=α1+α2) and the intensity of index light in the light detection unit 4a (the one light detection unit 4) and the light detection unit 4b (the other light detection unit 4), respectively. In the graphs of FIG. 7A and FIG. 7B, α1=α2=α, and the sum of tilt angles=2·α.

From FIG. 7A and FIG. 7B, it can be seen that, when the mirror unit 30 is swung with ±symmetry with respect to a mirror vertical surface 43, setting the range of the sum of tilt angles to 80° to 120°, especially to approximately 100° to approximately 110°, is advantageous to increase the relative intensity of the twice reflected light L2. "2·54.7°" is included in the range of 80° to 120° as the advantageous sum of tilt angle.

Figure 8:
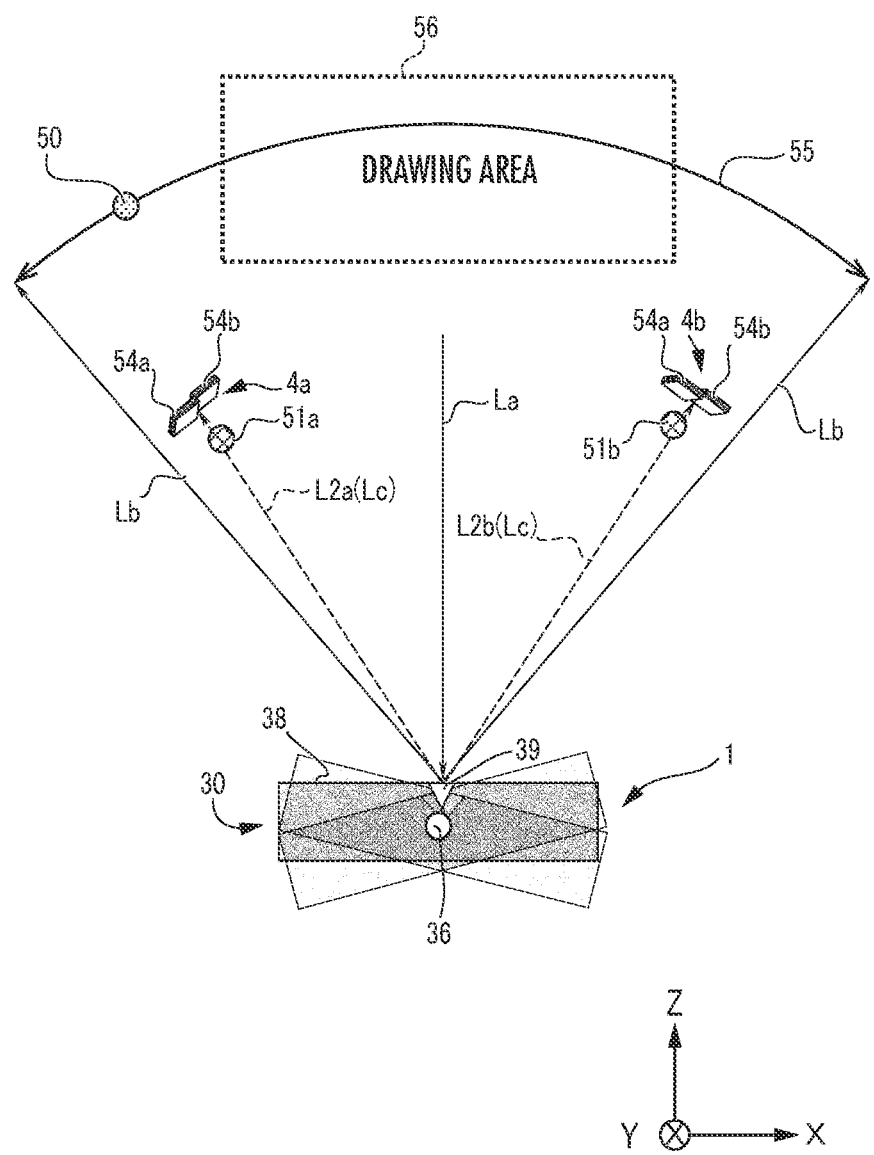
FIG. 8 is a schematic explanatory diagram of drawing by the optical scanning device.

FIG. 8 is a schematic explanatory diagram of drawing by the optical scanning device 1. The optical scanning device 1 is a one-dimensional drawing type optical scanning device, so that a drawing area 56 is a one-dimensional drawing area accordingly. In the case of a two-dimensional drawing type optical scanning device (the light deflector 103 in FIG. 19 and FIG. 20, which will be described later), the drawing area 56 will be a two-dimensional area that expands not only horizontally but also vertically.

The mirror unit 30 performs reciprocating rotation about the rotation axis 36. Of the original light La incident on the mirror unit 30, a part that is incident on the flat reflection part 38 turns into the scanning light Lb, which is emitted from the mirror unit 30. The scanning light Lb generates the scanning light spot 50 at an irradiation destination. The scanning light spot 50 reciprocates along a scanning trajectory 55 as the mirror unit 30 performs the reciprocating rotation about the rotation axis 36. The drawing area 56 is set in the central area of the scanning trajectory excluding both end portions from the whole of the scanning trajectory 55.

Of the original light La incident on the mirror unit 30, a part that is incident on the groove-shaped reflection part 39 turns into the detection light Lc, which is emitted from the mirror unit 30. The emission angle γ of the twice reflected light L2 of the detection light Lc is ±38.8° independently of the reciprocating rotation of the mirror unit 30 about the rotation axis 36.

Light detectors 54a and 54b are composed of, for example, PDs (photodetectors). The light detectors 54a and 54b are disposed in the directions of −38.8° and +38.8°, respectively, as a first light detector and a second light detector to receive index light spots 51a and 51b of the twice reflected light L2. The positions of the light detectors 54a and 54b are set outside the drawing area 56 in the scanning trajectory 55.

FIG. 9 is a schematic diagram illustrating the relationship between the scanning light spot 50 and index light spots 51a and 51b, and the light detection units 4a and 4b. The scanning light spot 50 is generated at the irradiation destination of the scanning light Lb generated when the original light La is reflected on the flat reflection part 38. The index light spots 51a and 51b are generated on the light receiving surfaces of the light detection units 4a and 4b, which are the irradiation destinations of twice reflected light L2a and twice reflected light L2b which are generated when the original light La is reflected on the groove-shaped reflection part 39.

The light detection units 4a and 4b are positioned on the scanning trajectory 55 of the scanning light spot 50, and also positioned on the light paths of the twice reflected light L2a and the twice reflected light L2b.

Figure 10A:
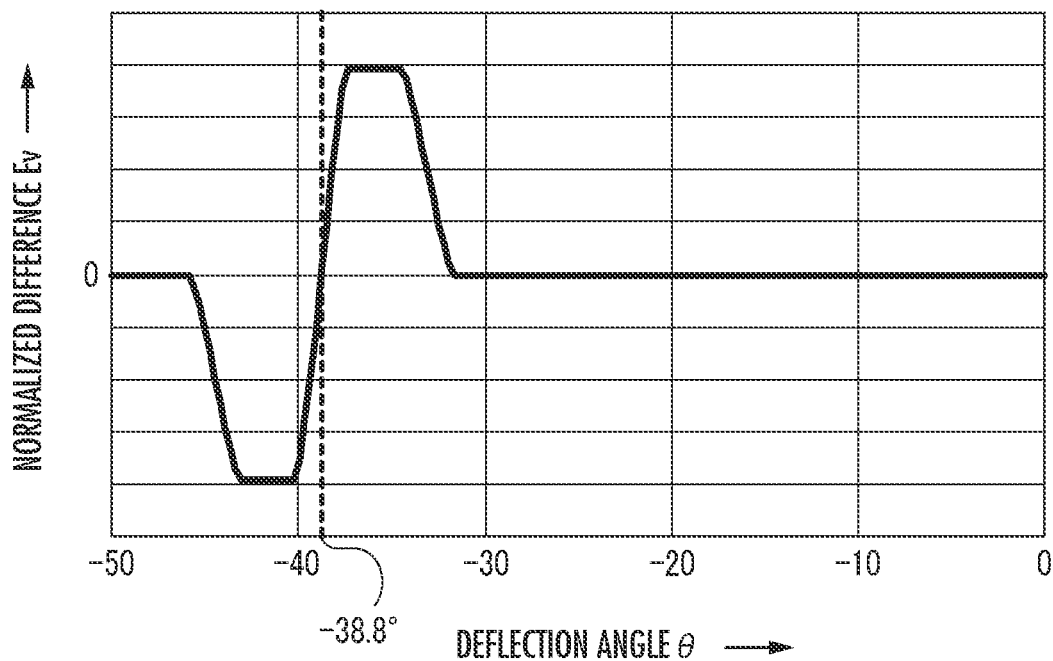
FIG. 10A is a graph illustrating the relationship between the deflection angle of the mirror unit and a normalized difference in one light detection unit.
Figure 10B:
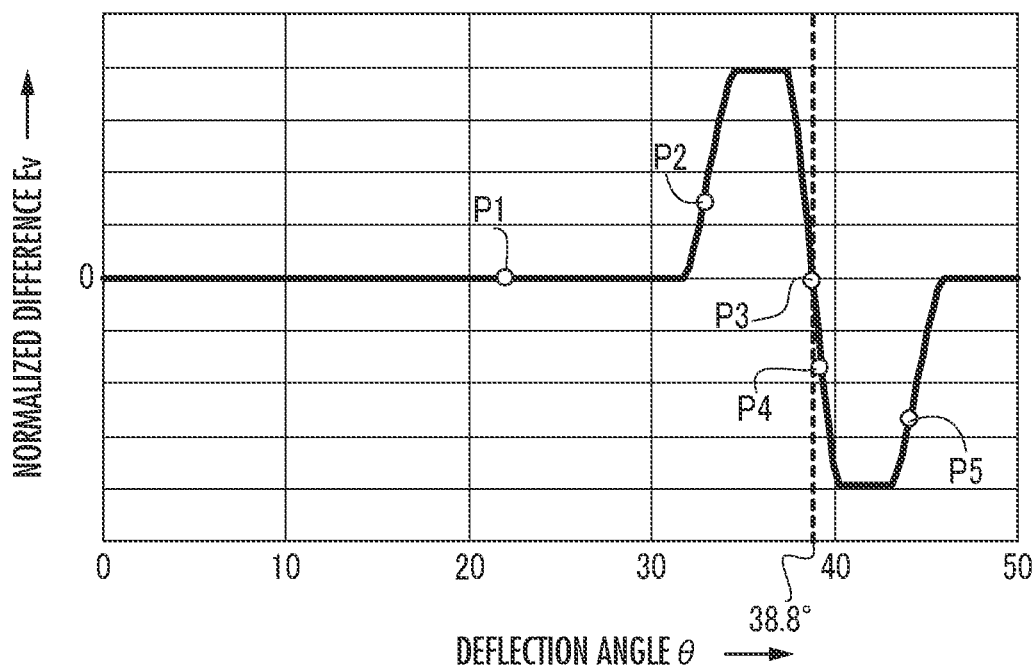
FIG. 10B is a graph illustrating the relationship between the deflection angle of the mirror unit and the normalized difference in the other light detection unit.

FIG. 10A and FIG. 10B are graphs illustrating the relationship between the deflection angle θ of the mirror unit 30 and the normalized difference Ev in the light detection units 4a and 4b, respectively.

The normalized difference Ev is defined by the following Formula 1.

[Math. 1]
$$Ev = \frac{Va - Vb}{Va + Vb} \quad \text{(Formula 1)}$$

where in Formula 1, Va and Vb denote the output voltages of the light detectors 54a and 54b, respectively, in each light detection unit 4.

In Formula 1, the numerator of the right side is the difference between Va and Vb. The denominator of the right side is the sum of Va and Vb, and is for generating a normalized difference Ev in which the numerator difference is normalized regardless of the type of the optical scanning device 1.

By design, the light detection units 4a and 4b are expected to be disposed such that the centers of the index light spots 51a and 51b overlap the division line 53, which serves as the boundary line of the light detectors 54a and 54b. However, in practice, due to manufacturing errors or the like, the light detection units 4a and 4b are inconveniently attached with the division line 53 deviated from the reflection direction of the index light spots 51a and 51b in some cases. In such a case, even if the deflection angle of the mirror unit 30 reaches the reflection angle of the twice reflected light L2, the Va−Vb, which is the difference under the condition of α1=α2=54.7°, inconveniently changes from 0 (zero) depending on the intensity of the once reflected light L1 and the twice reflected light L2.

However, Formula 1 of the normalized difference Ev under the condition of α1=α2=54.7° eliminates the influences by the difference in intensity between the twice reflected light L2 from the groove-shaped reflection part 39 and the once reflected light L1 from the flat reflection part 38, thus making it possible to accurately detect the timing at which the deflection angle θ of the mirror unit 30 reaches the reflection angle of the twice reflected light L2.

This is because, although the normalized difference Ev of Formula 1 is not zero when the deflection angle θ reaches the reflection angle of the twice reflected light L2 (=index deflection angle ±38.8°), the normalized difference Ev of Formula 1 remains at the same level regardless of the intensities of the once reflected light L1 and the twice reflected light L2.

The method for detecting the deflection angle θ is not limited to the difference method of Formula 1. The detection can be also performed based on the ratio of the outputs of the light detectors 54a and 54b (Va/Vb) in place of the difference.

Figure 11:
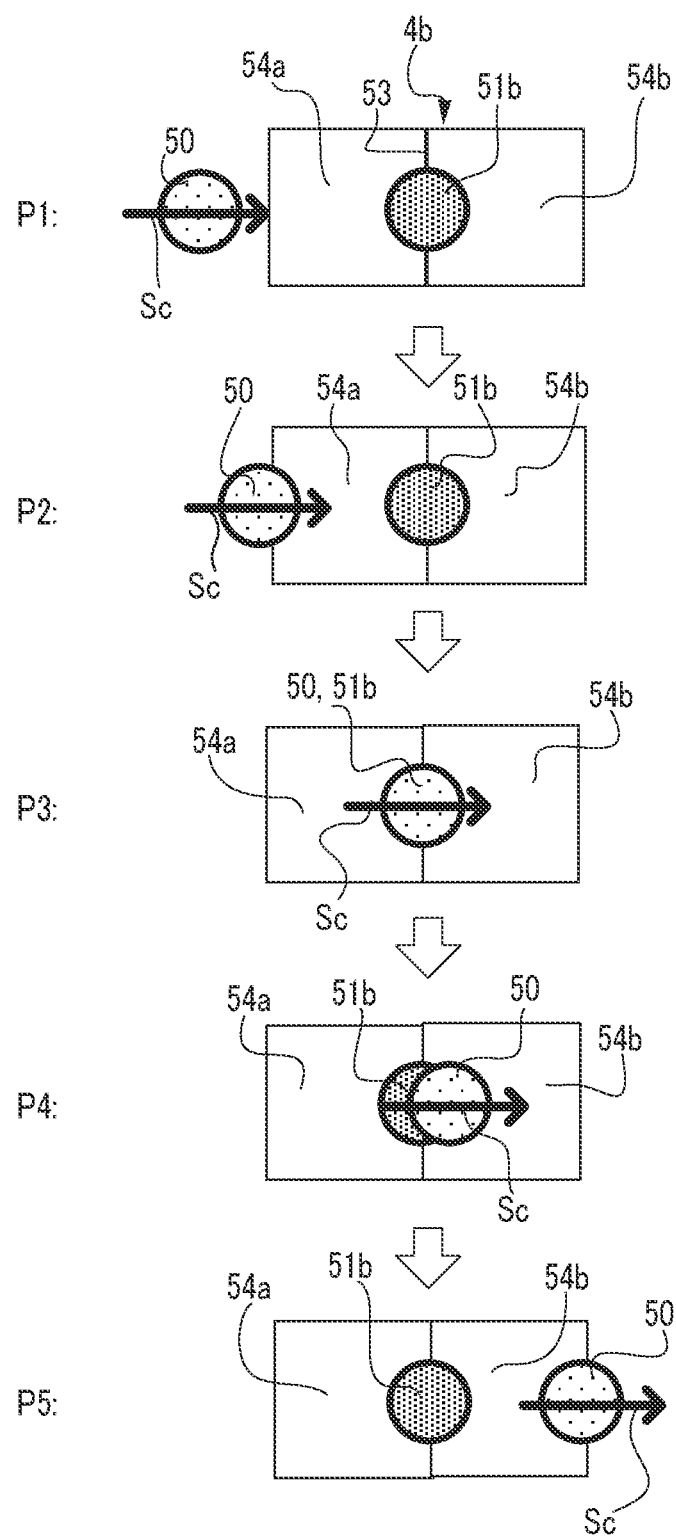
FIG. 11 is a schematic diagram illustrating the relative positions of the scanning light spot and the index light spot at P1 to P5 of FIG. 10B and the light detectors in the light detection unit.

FIG. 11 is a schematic diagram illustrating the relative positions of the scanning light spot 50 and the index light spot 51b and the light detectors 54a and 54b in the light detection unit 4b at P1 to P5 of FIG. 10B. Sc denotes the scanning direction of the scanning light spot 50.

The following will describe the normalized difference Ev at each position of P1 to P5, assuming that the division line 53 is located at a position in the direction of ±38.8° of the normal emission angle γ, as with the case of FIG. 10A and FIG. 10B. In the following description, it is assumed that the division line 53 is located at a position in the direction of the emission angle γ=±38.8°, which is the normal position, and there are no variations in the output characteristics of the light detectors 54a and 54b.

At P1, the scanning light spot 50 is in front of the light detection unit 4b in the scanning direction Sc. The index light spot 51b is located at a position where the center thereof overlaps the division line 53. Therefore, each of the light detectors 54a and 54b receives the light amount of half of the index light spot 51b. Consequently, the normalized difference Ev=0.

At P2, the front end of the scanning light spot 50 enters the light detector 54a. The index light spot 51b is at the same position as that at P1. Therefore, the light detector 54a receives the half of the index light spot 51b and the front end portion of the scanning light spot 50. Consequently, the normalized difference Ev is expressed as Ev>0.

At P3, the center of the scanning light spot 50 reaches a position where the center thereof overlaps the division line 53. The front half of the scanning light spot 50 overlaps the light detector 54b. Consequently, the light amount of the index light spot 51b and the scanning light spot 50 is also divided into two equal parts by the division line 53, leading to Ev=0. The deflection angle θ of the mirror unit 30 at this time is 38.8°.

At P4, the center of the scanning light spot 50 enters the light detector 54b. Therefore, Ev<0.

At P5, in the scanning direction Sc, the scanning light spot 50 has the first half thereof positioned outside the light detection unit 4b and the latter half thereof remaining in the light detector 54b. Therefore, the normalized difference Ev is expressed as Ev<0, as illustrated by P5 in FIG. 10B.

When the scanning light spot 50 passes through the division line 53 of the light detection units 4a and 4b in the scanning direction Sc, the sign of the normalized difference Ev is reversed from positive to negative. On the other hand, when the scanning light spot 50 passes through the division line 53 of the light detection units 4a and 4b in the direction opposite to the scanning direction Sc, the sign of the normalized difference Ev is reversed from negative to positive.

The deflection angle detection unit 26 recognizes the timing at which the sign of the normalized difference Ev is reversed as the timing at which the deflection angle θ of the mirror unit 30 is ±38.8°.

The mirror unit 30 performs the reciprocating rotation about the rotation axis 36, so that the scanning light spot 50 reciprocates to left and right on the scanning trajectory 55 in FIG. 9. When the scanning light spot 50 travels from left to right on the scanning trajectory 55, the deflection angle θ changes in an increasing direction. When the scanning light spot 50 travels from right to left on the scanning trajectory 55, the deflection angle θ changes in a decreasing direction.

In the light detection unit 4a, the timing at which the normalized difference Ev of the light detection unit 4a is reversed from positive to negative is detected as the timing at which the scanning light spot 50 passes through the division line 53 of the light detection unit 4 from the outer side to the inner side. The timing at which the normalized difference Ev is reversed from negative to positive is detected as the timing at which the scanning light spot 50 passes through the division line 53 of the light detection unit 4 from the inner side to the outer side.

In the light detection unit 4b, the timing at which the normalized difference Ev of the light detection unit 4b is reversed from positive to negative is detected as the timing at which the scanning light spot 50 passes through the division line 53 of the light detection unit 4 from the inner side to the outer side. The timing at which the normalized difference Ev of the light detection unit 4b is reversed from negative to positive is detected as the timing at which the scanning light spot 50 passes through the division line 53 of the light detection unit 4 from the outer side to the inner side.

The deflection angle detection unit 26 constantly monitors the outputs of the light detection unit 4a and the light detection unit 4b. The deflection angle detection unit 26 sets the timing at which the light detection unit 4a reverses from positive to negative as t1 on a time axis, and then sets the timing at which the light detection unit 4b reverses from positive to negative as t2 on the time axis. The time difference t2−t1 can be grasped as the time required for the deflection angle θ of the mirror unit 30 to change from −38.8° to +38.8°. On the other hand, the cycle of the reciprocating rotation of the mirror unit 30 about the rotation axis 36 and the distance between the light detection units 4a and 4b are fixed. Therefore, the scanning speed of the scanning light spot 50 is determined based on the time difference t2−t1 and the distance, and further, a maximum deflection angle θ of the mirror unit 30 about the rotation axis 36 (i.e., the angle range in which the deflection angle θ changes or the deflection width of the scanning light spot 50) can be detected based on the scanning speed.

Figure 12:
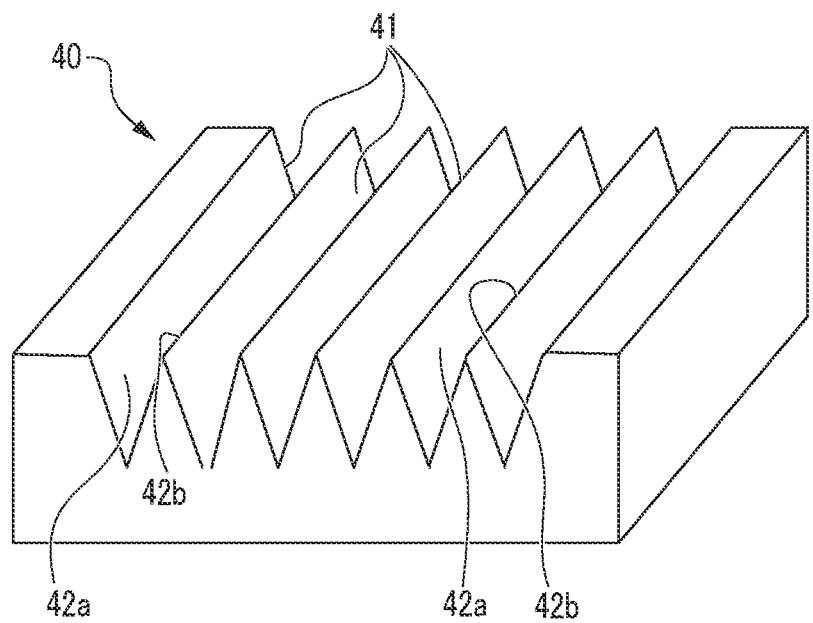
FIG. 12 is a perspective view of a groove-shaped reflection part having a plurality of longitudinal grooves.

FIG. 12 is a perspective view of the groove-shaped reflection part 40 having a plurality of longitudinal grooves 41. The groove-shaped reflection part 39 has only one longitudinal groove 41, so that the intensity of the index light spots 51a and 51b is low. On the other hand, the groove-shaped reflection part 40 includes the plurality of the longitudinal grooves 41. As a result, the light receiving intensity of the index light spots 51a and 51b can be increased in the light detection units 4a and 4b.

On the other hand, the presence of the plurality of the longitudinal grooves 41 causes the twice reflected light L2 from each longitudinal groove 41 to interfere with each other. The interference effect intensifies the twice reflected light L2, thus making it possible to further increase the light receiving intensity of the index light spots 51a and 51b in the light detection units 4a and 4b.

Thus, a pitch Dp of the longitudinal grooves 41 (the interval of the longitudinal grooves 41 in the X-axis direction when the light deflector 3 is in a stationary state) is set according to the following Formula 2.

[Math. 2]

$$Dp = \frac{m\lambda}{\sin(2\alpha_1 + 2\alpha_2 - 180°)} \quad \text{(Formula 2)}$$

where in Formula 2, m denotes a natural number, λ denotes the wavelength of the original light La, and α1 and α2 are 54.7° in the present embodiment.

The pitch Dp of the longitudinal grooves 41 in the X-axis direction is calculated according to Formula 2. Consequently, the light detection unit 4 is located at a position where a plurality of twice reflected lights L2 from the groove-shaped reflection part 40 intensify each other, thus making it possible to increase the S/N ratio of an output of the light detection unit 4 and thereby to improve the accuracy of detecting the deflection angle θ.

(Measures Against Thrice Reflected Light)

Figure 13:
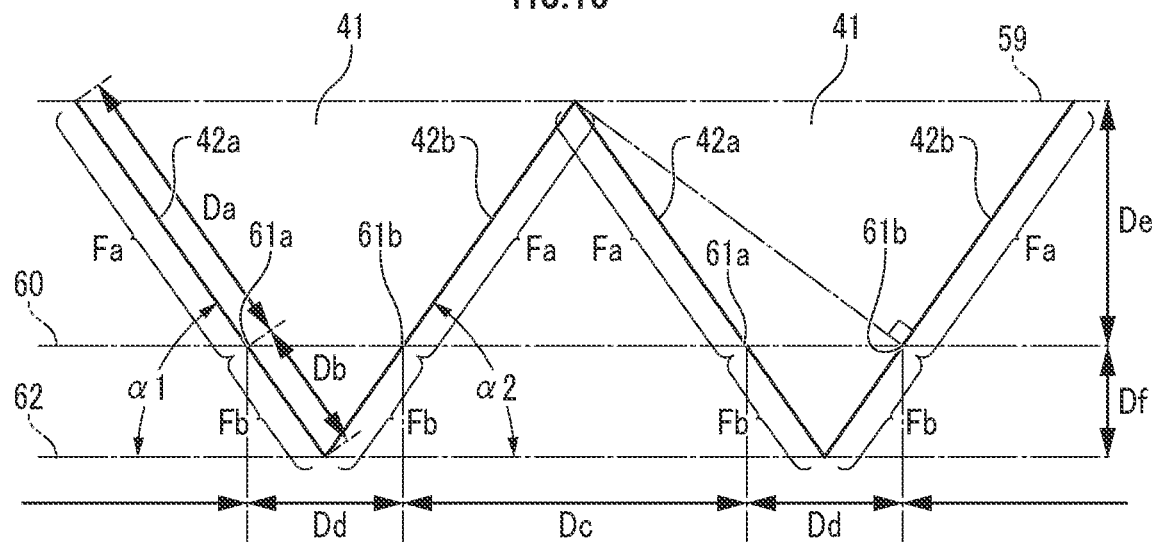
FIG. 13 is an explanatory diagram illustrating preventive measures against thrice reflected light.

Next, FIG. 13 is an explanatory diagram illustrating the preventive measures against the thrice reflected light L3. The measures against the thrice reflected light L3 will be described with reference to the groove-shaped reflection part 40 (FIG. 12). The same measures can be applied to the groove-shaped reflection part 39 (FIG. 2).

For the convenience of explanation, a first plane 59, a second plane 60, and a third plane 62, which are parallel to each other, will be defined. The first plane 59 is a plane at a position where the longitudinal groove 41 opens at the front surface side of the light deflector 3 in the Z-axis direction. The flat reflection surface of the flat reflection part 38 is included in the first plane 59. The third plane 62 is a plane that connects the valley bottoms of the plurality of longitudinal grooves 41 formed by V-grooves in the groove-shaped reflection part 40.

The second plane 60 is set, as a division plane, at a position midway between the first plane 59 and the third plane 62 in the Z-axis direction. The inclined surfaces 42a and 42b are bisected into a front surface side inclined surface portion Fa and a back surface side inclined surface portion Fb with the second plane 60 as a boundary.

Da denotes the length of the front surface side inclined surface portion Fa in a cross section of the longitudinal groove 41. Db denotes the length of the back surface side inclined surface portion Fb in a cross section of the longitudinal groove 41. Dc denotes the dimension in the X-axis direction between an intersection line 61b and an intersection line 61a, which are adjacent to each other in the relationship of the negative side and the positive side in the X-axis direction in the cross section of the longitudinal groove 41. Dd denotes the dimension in the X-axis direction between the intersection line 61a and the intersection line 61b, which are adjacent to each other in the relationship of the negative side and the positive side in the X-axis direction. De and Df denote the dimensions of the front surface side inclined surface portion Fa and the back surface side inclined surface portion Fb in the Z-axis direction (the depth direction of the longitudinal groove 41).

The relationship of the following Formula 3 holds among Da to Df, where α1=α2=α applies.

$$Da:Db=Dc:Dd=De:Df=|\tan(2\cdot\alpha)|:|\tan(\alpha)| \quad \text{(Formula 3)}$$

Figure 14:
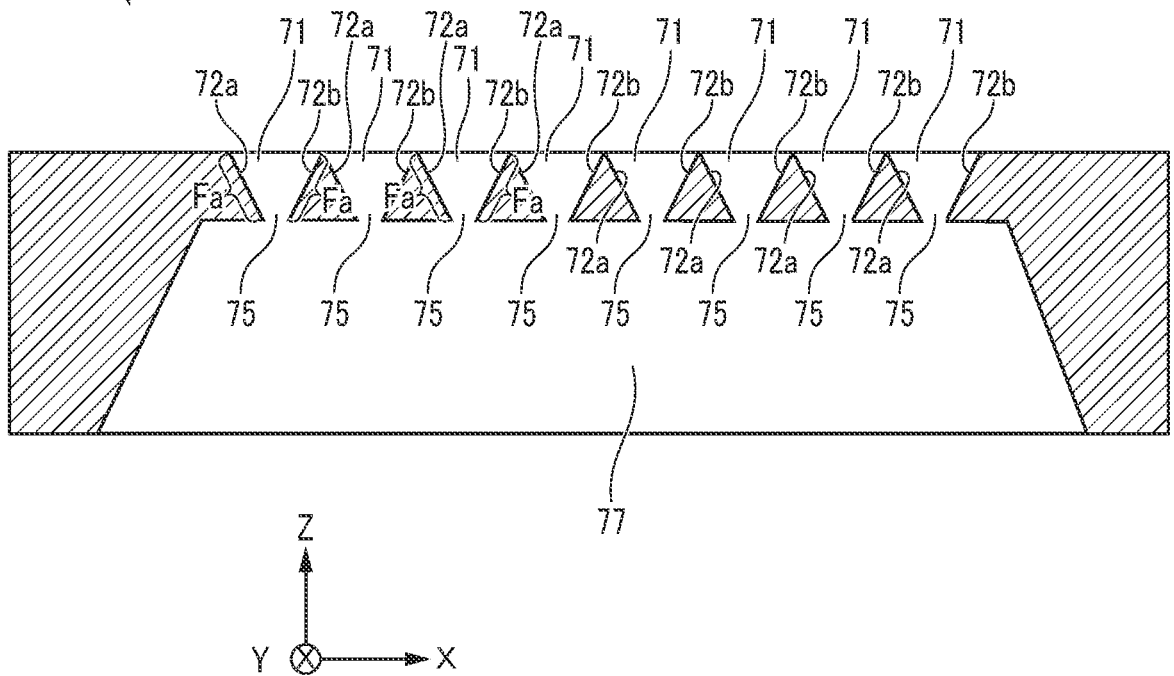
FIG. 14 is a cross-sectional view of a groove-shaped reflection part provided with measures against thrice reflected light.

FIG. 14 is a cross-sectional view of a groove-shaped reflection part 69 provided with measures against the thrice reflected light L3. An inclined surface 72 of a longitudinal groove 71 of the groove-shaped reflection part 69 is constructed by removing the back surface side inclined surface portion Fb from the inclined surfaces 42a and 42b of the longitudinal groove 41 of the groove-shaped reflection part 39 (FIG. 13), leaving only the front surface side inclined surface portion Fa.

As with the plurality of longitudinal grooves 41 of the groove-shaped reflection part 39, a plurality of the longitudinal grooves 71 of the groove-shaped reflection part 69 are aligned in parallel to the rotation axis 36 in the vertical direction. The length of the inclined surface 72 is set to Da (FIG. 13). Each of the longitudinal grooves 71 has a valley side opening 75 on the rear surface side. A recess 77 is formed on the rear surface side of the groove-shaped reflection part 69, and each of the valley side openings 75 is in common communication with the recess 77.

As a result, in the groove-shaped reflection part 69, of the original light La, a part of the original light La that is irradiated to the back surface side inclined surface portion Fb of the groove-shaped reflection part 39 (FIG. 3) exits to the rear surface side of the mirror unit 30 from the valley side opening 75. Therefore, in the groove-shaped reflection part 69, the generation of the thrice reflected light L3 overlapping the twice reflected light L2 is prevented.

(Another Example Using the Index Light)

Figure 15:
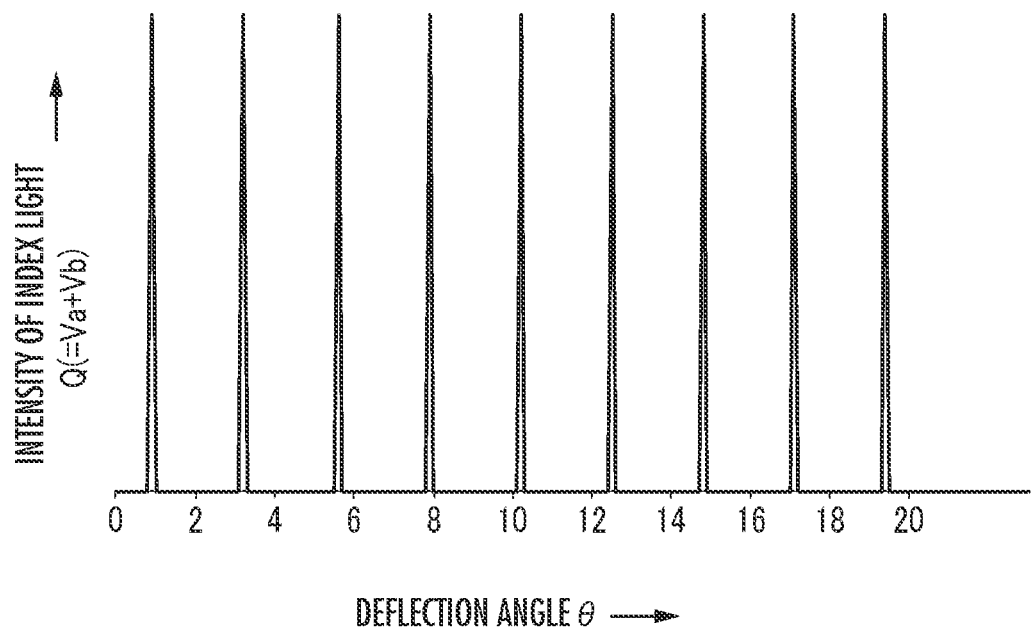
FIG. 15 is a diagram illustrating the relationship between the deflection angle and the intensity of twice reflected light when the groove-shaped reflection part of FIG. 1 is adopted.

FIG. 15 illustrates the relationship between the deflection angle θ and the intensity of the twice reflected light L2 when the groove-shaped reflection part 40 of FIG. 12 is adopted. When there are a plurality of longitudinal grooves 41, a plurality of twice reflected lights L2 from the plurality of the longitudinal grooves 41 interfere with each other, thus causing the intensity of the index light spot 51 in the light detection unit 4 to change according to the deflection angle θ, as illustrated in FIG. 15.

Therefore, the controller 21 not only calculates the normalized difference Ev between the output Va of the light detector 54a and the output Vb of the light detector 54b (=Va−Vb) but also calculates a total Et of the output Va of the light detector 54a and the output Vb of the light detector 54b (=Va+Vb). Further, the deflection angle θ other than the deflection angle θ=±38.8° (the deflection angle θ corresponding to each peak in FIG. 15) can be also measured based on a total Q.

Figure 16:
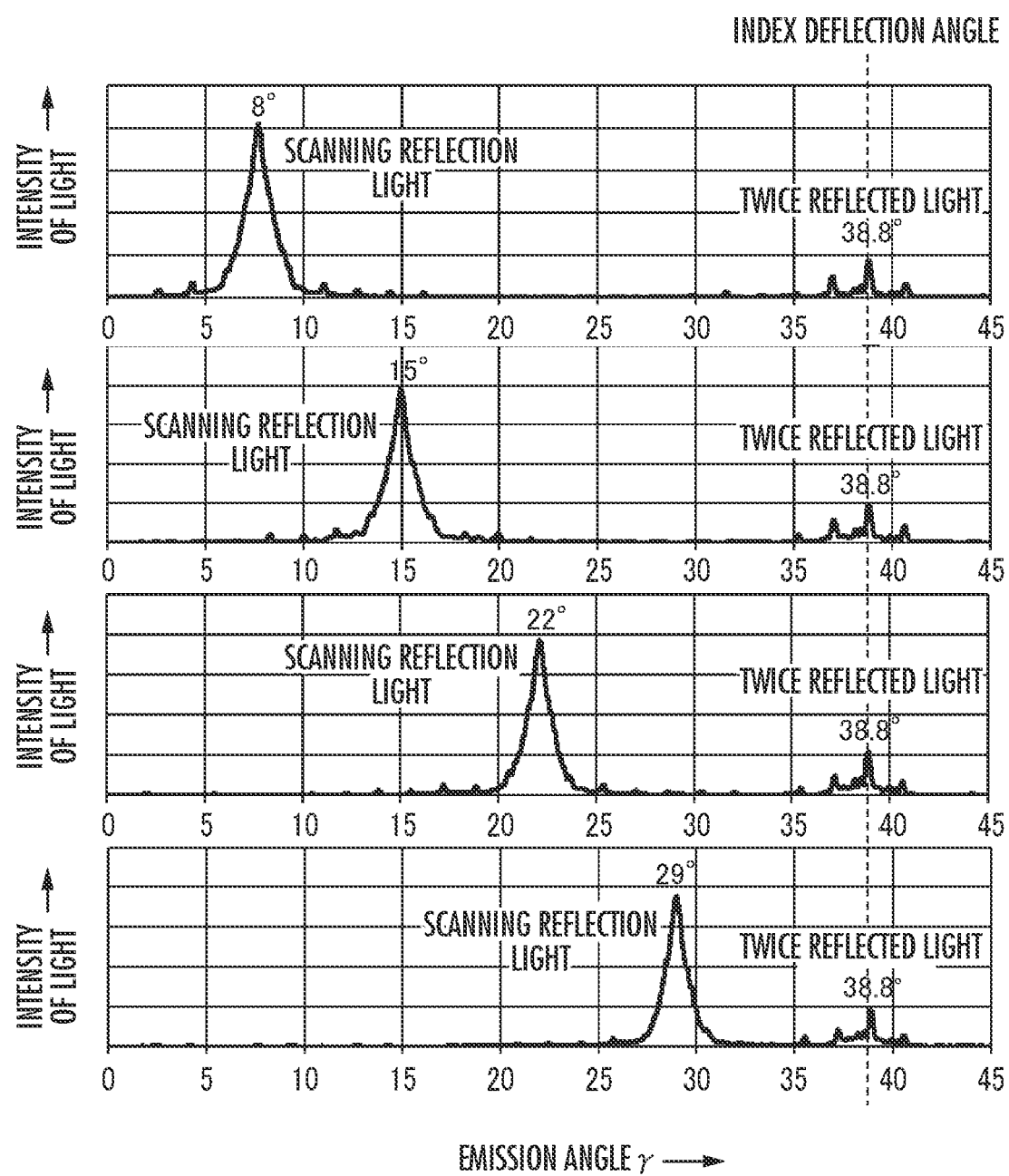
FIG. 16 presents graphs, each illustrating the relationship between the emission angle and the light intensity on the emission side at various deflection angles of the mirror unit, the relationship having been found by experiments.

FIG. 16 presents graphs, each illustrating the relationship between the emission angle γ and the light intensity on the emission side at various deflection angles θ of the mirror unit 30, the relationships having been found by experiments. Although the emission angle γ of the scanning light Lb increases as the deflection angle θ of the mirror unit 30 increases, the emission angle θ of the twice reflected light L2 is maintained constantly at the index deflection angle 38.8°. Further, it can be seen that the emission angle γ can be detected over the entire deflection width Wb (FIG. 1) of the scanning light Lb.

Figure 17:
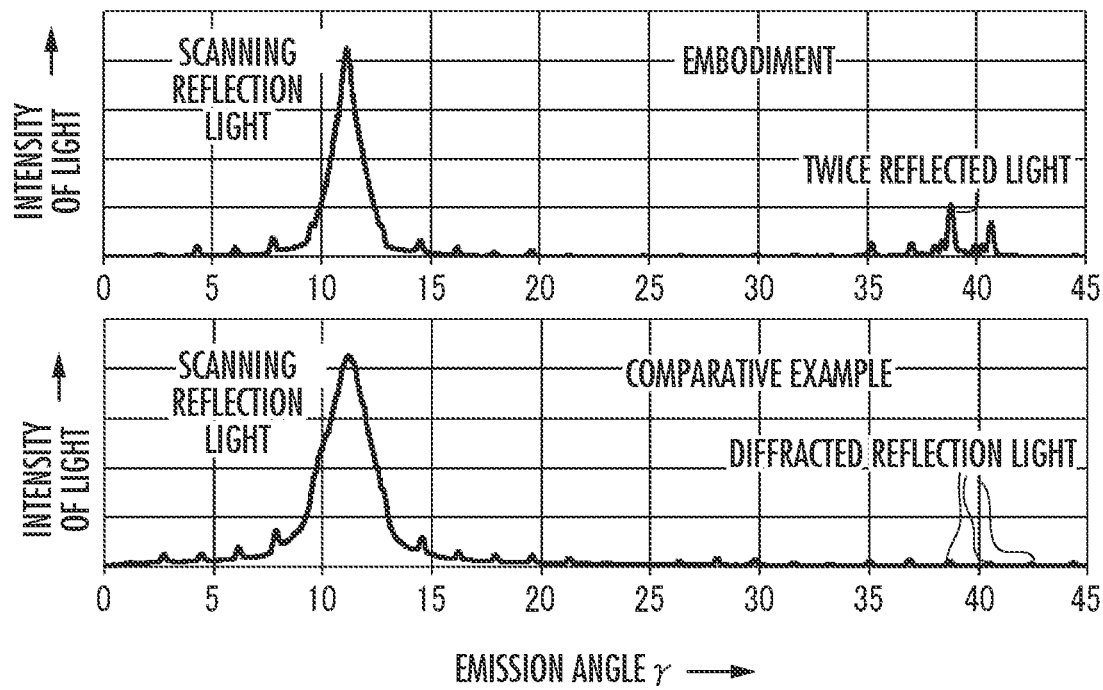
FIG. 17 is a graph of experiment results illustrating the comparison between an embodiment and a comparative example regarding the distribution of light intensities on the emission side with respect to a predetermined deflection angle.

FIG. 17 presents graphs illustrating the experiment results of the comparison in the distribution of light intensity on the emission side with respect to predetermined deflection angles θ between the mirror unit 30 (the embodiment) and a comparative example. The comparative example uses a diffraction grating type mirror unit. It can be seen that the twice reflected light L2 is generated in the mirror unit 30, whereas no noticeable diffracted light, such as second-order light, third-order light and so on, is generated in the comparative example.

Figure 18:
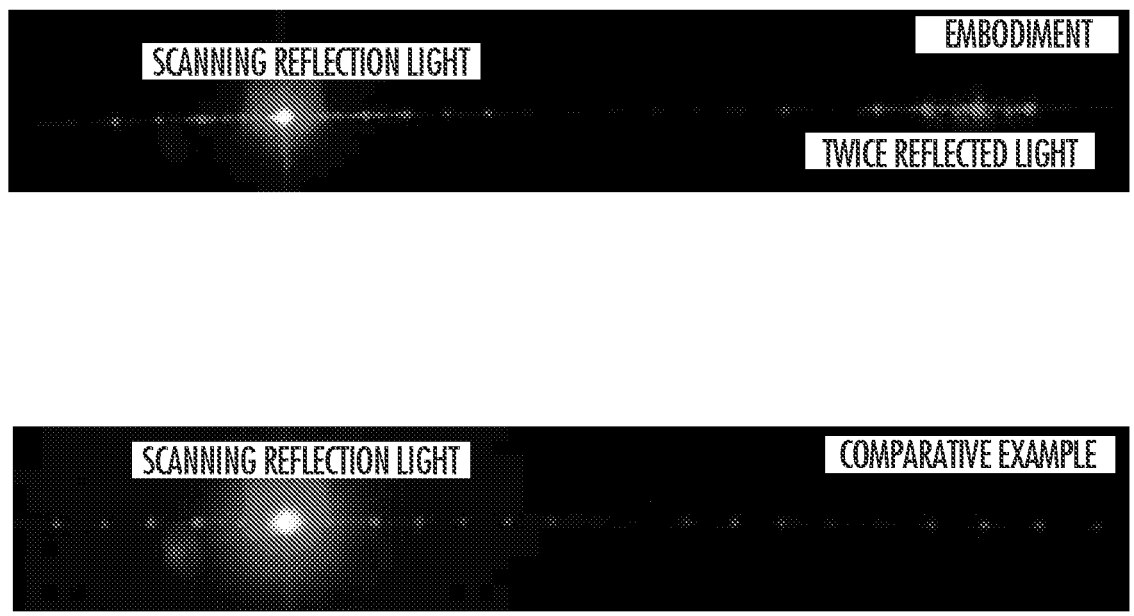
FIG. 18 is a photograph of the experiment results of FIG. 17.

FIG. 18 presents photographs illustrating the experiment results of FIG. 17. It can be seen that the twice reflected light L2 appears at the index deflection angle in the mirror unit 30 (the embodiment), whereas no light appears at the index deflection angle in the comparative example (the diffraction grating type mirror unit).

(Two-Axis Scanning Type Optical Scanning Device)

Figure 19:
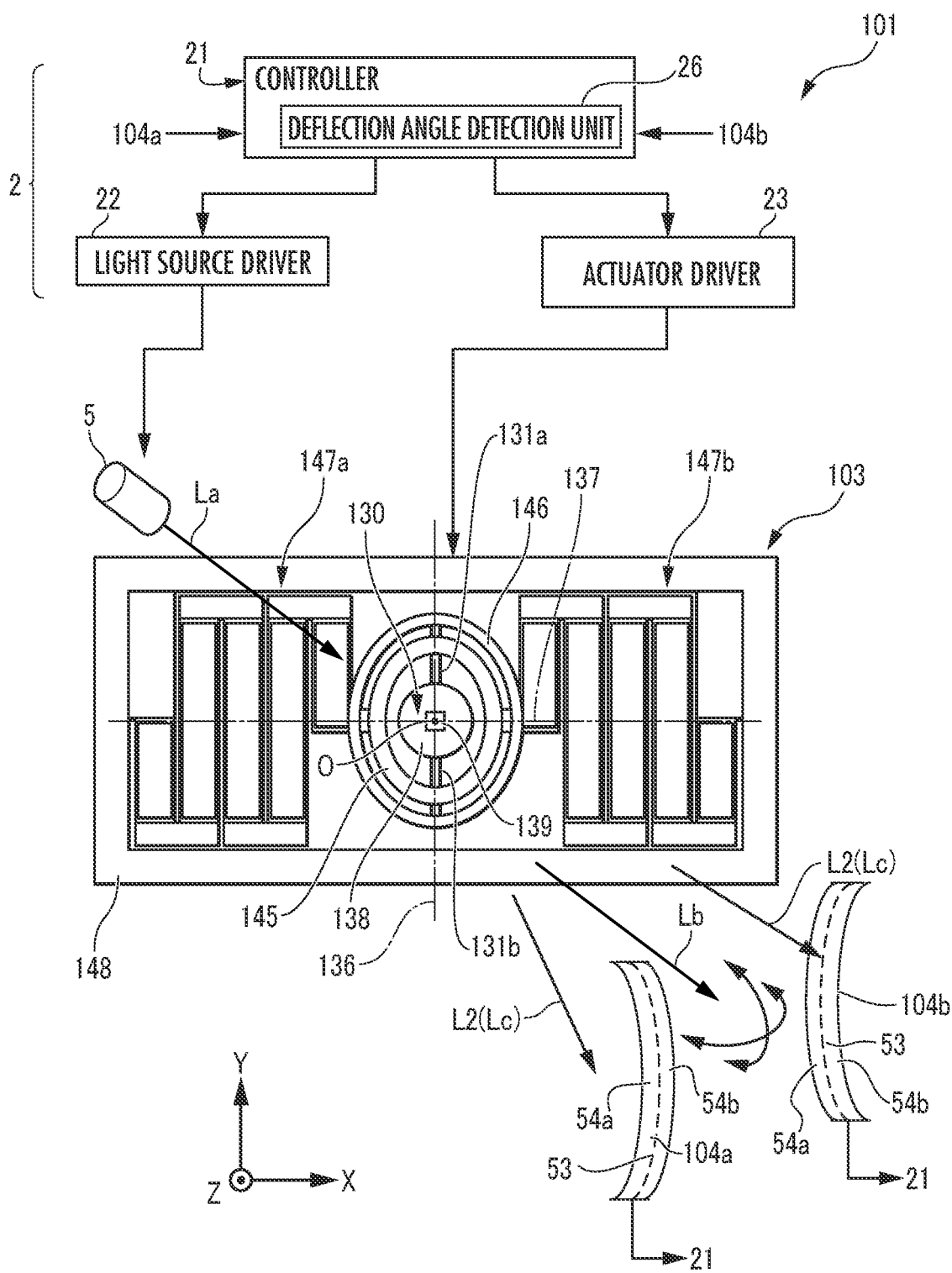
FIG. 19 is a configuration diagram of an optical scanning device provided with a two-dimensional scanning type light deflector.

FIG. 19 is a configuration diagram of an optical scanning device 101 provided with a two-axis (two-dimensional) scanning type light deflector 103. As the two-axis scanning type optical scanning device, the two-axis scanning type light deflector 103 is provided therein.

The optical scanning device 101 differs from the optical scanning device 1 in that the optical scanning device 101 includes the light deflector 103 and a light detection unit 104 in place of the light deflector 3 and the light detection unit 4 of the optical scanning device 1. The following will describe the light deflector 103 and the light detection unit 104.

The light deflector 103 has the same configuration as a known two-axis piezoelectric light deflector (e.g., Japanese Unexamined Patent Application Publication No. 2017-207630) except for a mirror unit 130. The mirror unit 130 will be described in detail later. The structure of the light deflector 103 will be briefly described.

The light deflector 103 includes the mirror unit 130, torsion bars 131a and 131b, inner piezoelectric actuators 145a and 145b, a movable frame 146, outer piezoelectric actuators 147a and 147b, and a fixed frame 148.

A first rotation axis 136 and a second rotation axis 137 are both set on the front surface of the light deflector 103 and are orthogonal to each other at a center O of the mirror unit 130. The first rotation axis 136 coincides with the center axis of the torsion bar 131. When the light deflector 103 is stationary, the first rotation axis 136 and the second rotation axis 137 are in the Y-axis direction and the X-axis direction, respectively.

The inner piezoelectric actuator 145 torsionally vibrates the torsion bar 131 about the first rotation axis 136 at a resonant frequency. This Causes the mirror unit 130 to perform reciprocating rotation about the first rotation axis 136 at a resonant frequency F1. The outer piezoelectric actuator 147 causes the movable frame 146 to perform reciprocating rotation about an axis parallel to the X-axis at a non-resonant frequency F2 (F2<F1). Consequently, the mirror unit 130 performs reciprocating rotation about the second rotation axis 137.

The mirror unit 130 will now be described in detail. Unlike the mirror unit 30, the mirror unit 130 performs reciprocating rotation about the two axes, namely, the first rotation axis 136 and the second rotation axis 137, but has the same structure as that of the mirror unit 30. In other words, the mirror unit 130 has, on the front surface thereof, a flat reflection part 138 and a groove-shaped reflection part 139, which are identical to the flat reflection part 38 and the groove-shaped reflection part 39, respectively, of the mirror unit 30.

In the optical scanning device 101, the deflection angle θ of the mirror unit 130 about the first rotation axis 136 is detected by light detection units 104a and 104b. The light detection units 104a and 104b correspond to the light detection units 4a and 4b, respectively, of the optical scanning device 1.

Whereas the light detection units 4a and 4b are formed to be rectangular, the light detection units 104a and 104b are formed to have a long narrow shape in the Y-axis direction. This is because the mirror unit 130 performs reciprocating rotation also about the second rotation axis 137, so that the emission direction of the twice reflected light L2, which is fixed in the optical scanning device 1, is displaced to the Y-axis direction in the light deflector 103.

In the twice reflected light L2, the central portion in the displacement direction approaches inward in the X-axis direction with respect to both ends in the displacement in the Y-axis direction. This is reflected, and the division line of the light detection units 104a and 104b extends inward in the X-axis direction with respect to both ends in the central portion in the Y-axis direction.

[Detection of Non-Resonant Deflection Angles]

Figure 20:
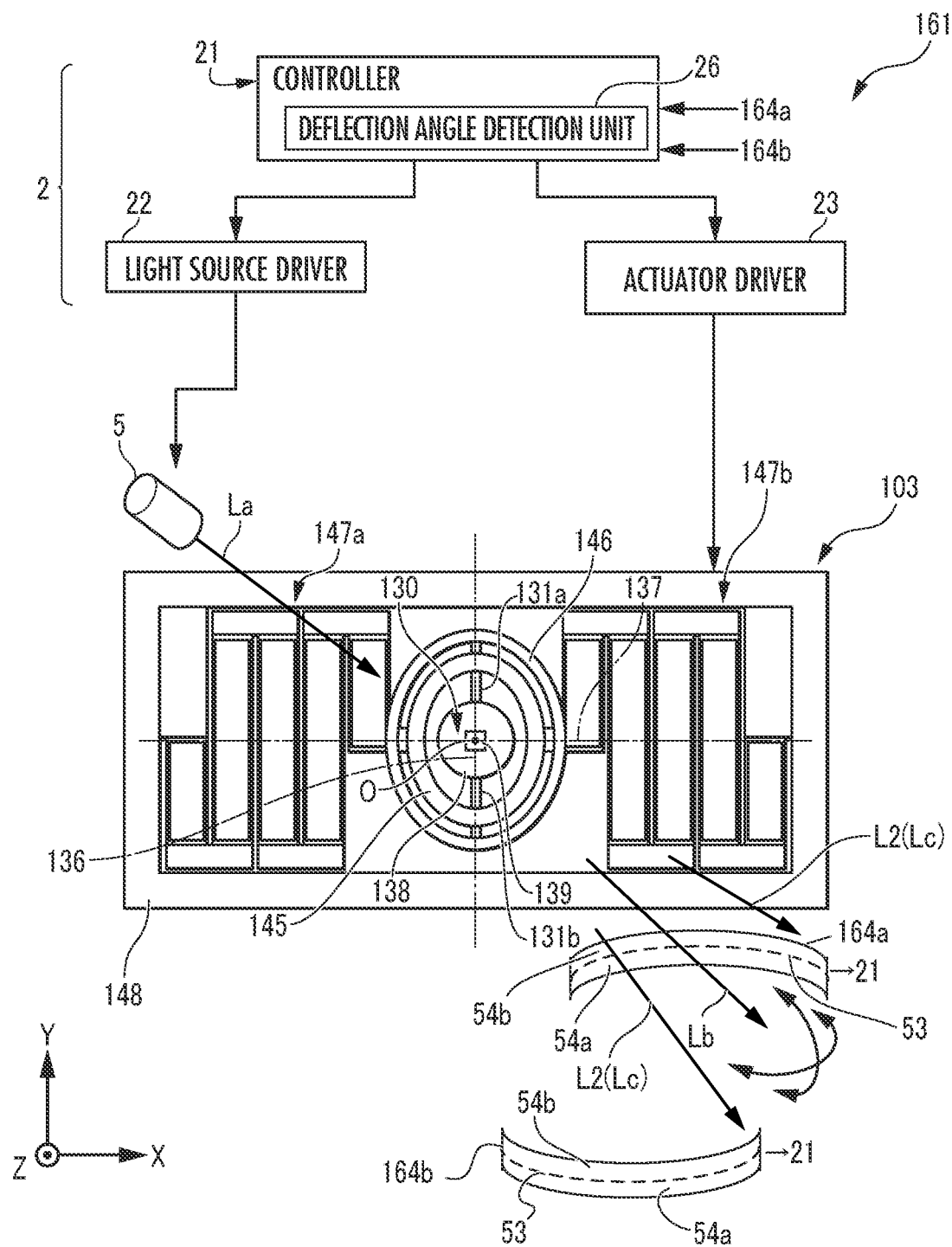
FIG. 20 is a configuration diagram of an optical scanning device capable of detecting the deflection angle of a mirror unit about a second rotation axis.

FIG. 20 is a configuration diagram of an optical scanning device 161 capable of detecting the deflection angle of a mirror unit 130 about a second rotation axis 137. In the optical scanning device 161, only a different aspect from the optical scanning device 101 will be described.

A groove-shaped reflection part 139 of the mirror unit 130 has been rotated by 90° clockwise with respect to a center O of the mirror unit 130 of the optical scanning device 101. As a result, the twice reflected light L2 as the index light from the groove-shaped reflection part 139 is displaced in the X-axis direction while being emitted from the light deflector 103 to both sides in the Y-axis direction for the reciprocating rotation of the mirror unit 130 about the first rotation axis 136.

Thus, light detection units 164a and 164b that detect the twice reflected light L2 are formed to have the long narrow shape in the X-axis direction. Further, division lines 53 of the light detection units 164a and 164b extend such that the central portions thereof in the X-axis direction are on the inner side in the Y-axis direction with respect to both end portions.

As with the light detection units 4a and 4b of the optical scanning device 1, the light detection units 164a and 164b detect the normalized difference Ev and a subtraction difference Es of the output voltages Va and Vb of the light detectors 54a and 54b divided from the light detection units 164a and 164b, respectively, by division lines 53. In the optical scanning device 161, the normalized difference Ev and the subtraction difference Es correspond to the deflection angle of the mirror unit 130 about the second rotation axis 137, so that the deflection angle of the mirror unit 130 about the second rotation axis 137 is detected based on the normalized difference Ev and the subtraction difference Es.

Supplemental and Modified Examples

In the embodiment, the difference Va−Vb (refer to the aforementioned Formula 1) is used to detect the deflection angle θ of the mirror unit 30 about the first rotation axis (e.g., the rotation axis 36) based on the two outputs (e.g., Va and Vb) of the first and the second light detectors (e.g., 4a and 4b). In the present invention, the deflection angle θ can be detected based on the comparison of the two outputs (e.g., Va/Vb as the ratio of the two outputs) in place of the difference.

In the embodiment, the index deflection angle as the deflection angle θ of the mirror unit 30 associated with the traveling direction of index light (e.g., the twice reflected light L2) is set to 38.8°. The index deflection angle in the present invention can be changed to a numeric value other than 38.8°. The index deflection angle can be changed by, for example, changing the tilt angles α1 and α2 of the pair of inclined surfaces 42a and 42b in FIG. 4.

The first rotation axis in the present invention corresponds to the rotation axis 36 and the first rotation axis 136 in the embodiment, and the second rotation axis corresponds to the second rotation axis 137. In the present invention, the second rotation axis 137 of the embodiment can be used as the first rotation axis.

The first actuator of the present invention corresponds to the piezoelectric actuator 32 and the inner piezoelectric actuator 145. The second actuator of the present invention corresponds to the outer piezoelectric actuator 147. The first actuator and the second actuator of the embodiment are both piezoelectric, but the first actuator and the second actuator of the present invention may alternatively be electromagnetic coil type or electrostatic type actuators.

A specific structure example of an electromagnetic coil type actuator is described in detail in the following literature:

"A. D. Yalcinkaya, H. Urey, D. Brown, T. Montague, and R. Sprague, "Two-axis electromagnetic microscanner for high resolution displays," J. Microelectromech. Syst., vol. 15, no. 4, pp. 786-794, August 2006." In addition, a specific structure example of the aforementioned electrostatic type actuator is described in detail in the following literature: "H. Schenk, P. Durr, D. Kunze, H. Lakner, and H. Kuck, "A resonantly excited 2D-micro-scanning-mirror with large deflection," Sens. Actuators A, Phys., vol. 89, no. 1, pp. 104-111, March 2001."

In the light deflector 3 or 103, the groove-shaped reflection part 39 or 139 is provided only at the central portion, and the light detection unit 4 or 104 is provided at both sides of the light deflector 3 or 103. In the present invention, the deflection angle θ of the mirror unit 30 or 130 can be detected also by providing the groove-shaped reflection part 39 or 139 only at one side in the X-axis direction with respect to the center O, and providing the light detection unit 4 or 104 only at the other side in the X-axis direction with respect to the light deflector 3 or 103. Alternatively, the groove-shaped reflection part 39 or 139 may be provided at both sides, one side and the other side, with respect to the center O of the mirror unit 30 so as to cause the light detection unit 4 at the other side to receive the twice reflected light L2 from the groove-shaped reflection part 39 or 139 at one side, and to cause the light detection unit 4 at one side to receive the twice reflected light L2 from the groove-shaped reflection part 39 or 139 at the other side.

In a SOI active layer that constitutes the substrate layer of each of the light deflectors 3 and 103, the main surface thereof has Miller index (100), and the inclined surface 42 has Miller index (111). In a light deflector of the present invention, the main surface of a silicon crystal layer of a substrate may have Miller index (111) and the inclined surface 42 may have Miller index (100).

The flat reflection parts 38 and 138, and the groove-shaped reflection parts 39, 69, 89a, 89b and 139 are formed as a mirror surface layer covering the common substrate layer of the mirror units 30 and 130. The mirror surface layer is composed of, for example, a silicon crystalline surface, a metal reflective film or a dielectric multilayer film.

DESCRIPTION OF REFERENCE NUMERALS 1, 101, 161 . . . optical scanning device; 3, 103 . . . light deflector; 4 . . . light detection unit; 5 . . . light source; 21 . . . controller (deflection angle detection unit); 30, 130 . . . mirror unit; 32 . . . piezoelectric actuator (first actuator); 36 . . . rotation axis (first rotation axis); 38, 138 . . . flat reflection part; 39, 40, 69, 139 . . . groove-shaped reflection part; 41, 71 . . . longitudinal groove; 42a, 42b, 72a, 72b . . . inclined surface; 50 . . . scanning light spot; 51 . . . index light spot; 53 . . . division line; 54a, 54b . . . light detector; 55 . . . scanning trajectory; 59 . . . first plane (flat reflection surface); 60 . . . second plane (division plane); 136 . . . first rotation axis; 137 . . . second rotation axis; 145... inner piezoelectric actuator (first actuator); and 147... outer piezoelectric actuator (second actuator).

The invention claimed is:

1. An optical scanning device comprising:
a light source which emits light;
a light deflector having a mirror unit which includes: on a front surface side, a flat reflection part that emits incident light entering from the light source as scanning reflection light, and a groove-shaped reflection part having a longitudinal groove that extends in a predetermined direction and has a pair of inclined surfaces facing each other such that a groove width decreases from the front surface side to a back surface side, and which reflects the incident light a total of twice, once on each inclined surface and emits the reflected incident light as index light; and a first actuator that rotates the mirror unit in a reciprocating manner about a first rotation axis parallel to an extending direction of the longitudinal groove;
a light detection unit which is disposed on a scanning trajectory of a scanning light spot of the scanning reflection light and at a light reception position of an index light spot of the index light, and is divided into a first light detector and a second light detector by a division line that divides the index light spot in a scanning direction of the scanning reflection light; and
a deflection angle detection unit which detects a first deflection angle as a deflection angle of the mirror unit about the first rotation axis based on comparison between an output of the first light detector and an output of the second light detector.

2. The optical scanning device according to claim 1, wherein the deflection angle detection unit performs the comparison between an output of the first light detector and an output of the second light detector based on a difference between the two outputs.

3. The optical scanning device according to claim 1, wherein the deflection angle detection unit performs comparison of an output of the first light detector and an output of the second light detector based on a ratio of the two outputs.

4. The optical scanning device according to claim 1, wherein the deflection angle detection unit uses a deflection angle of the mirror unit associated with a traveling direction of the index light as an index deflection angle, and detects that a deflection angle of the mirror unit about the first rotation axis has reached the index deflection angle based on comparison between an output of the first light detector and an output of the second light detector.

5. The optical scanning device according to claim 1, wherein the deflection angle detection unit generates an intermediate value based on comparison of an output of the first light detector and an output of the second light detector, uses an intermediate value obtained in the case where the scanning light spot is not received as a reference value, and detects the first deflection angle based on a calibrated value obtained by calibrating the intermediate value by the reference value.

6. The optical scanning device according to claim 2, wherein the deflection angle detection unit uses, as an index deflection angle, a deflection angle of the mirror unit associated with a traveling direction of the index light, and detects a timing at which a deflection angle of the mirror unit becomes the index deflection angle based on a timing at which a sign of the difference is reversed.

7. The optical scanning device according to claim 5, wherein the intermediate value is a normalized difference Ev defined by Formula 1 given below:

$$Ev = \frac{Va - Vb}{Va + Vb} \quad \text{(Formula 1)}$$

wherein, in Formula 1, Va and Vb denote an output voltage of the first light detector and an output voltage of the second light detector, respectively.

8. The optical scanning device according to claim 5, wherein the light detection unit is provided as one and the other light detection units, one on each side, with respect to a center of a deflection angle range of the scanning light spot, and
wherein the deflection angle detection unit detects an angle range of the deflection angle of the scanning light spot based on a time difference between a sign inversion timing in the one light detection unit and a sign inversion timing in the other light detection unit.

9. The optical scanning device according to claim 1, wherein the pair of inclined surfaces are formed symmetrically with respect to a vertical plane perpendicular to a flat reflection surface of the flat reflection part.

10. The optical scanning device according to claim 9, wherein, in the case where a tilt angle of an inclined surface of the longitudinal groove with respect to the flat reflection surface is denoted by α, 2·α is within a range of 80° to 120°.

11. The optical scanning device according to claim 10, wherein the mirror unit has the flat reflection surface and the longitudinal groove on a front surface of a common substrate layer composed of a silicon crystal layer, and
wherein Miller indices of a main surface of the crystal layer and an inclined surface of the longitudinal groove are one and the other of (100) and (111), respectively.

12. The optical scanning device according to claim 1, wherein the longitudinal groove is open at least partly on the back surface side.

13. The optical scanning device according to claim 12, wherein in the case where the longitudinal groove is a V-groove, which opens on the front surface side of the mirror unit, and an inclined surface of the V-groove is divided into a front surface side inclined surface portion and a back surface side inclined surface portion by a division plane parallel to a flat reflection surface of the flat reflection part, an inclined surface of the longitudinal groove is formed of the front surface side inclined surface portion, and
wherein in the case where a length of the front surface side inclined surface portion and a length of the back surface side inclined surface portion in a cross section of the V-groove are denoted by Da and Db, respectively, and a tilt angle of the inclined surface of the longitudinal groove with respect to the flat reflection surface is denoted by α, the following applies:

$$Da:Db=|\tan(2 \cdot \alpha)|:|\tan(\alpha)|.$$

14. The optical scanning device according to claim 1, wherein the groove-shaped reflection part is disposed in such a manner as to overlap the first rotation axis in a front view of the mirror unit.

15. The optical scanning device according to claim 14, wherein the groove-shaped reflection part occupies a central part of the mirror unit.

16. The optical scanning device according to claim 15, wherein the light deflector includes a second actuator that rotates the mirror unit about a second rotation axis orthogonal to the first rotation axis in a reciprocating manner, and
wherein the light detection unit is formed in a long narrow shape in a scanning direction of the index light spot at the time of reciprocating rotation of the mirror unit about the second rotation axis.

17. The optical scanning device according to claim 1, wherein the groove-shaped reflection part has a plurality of the longitudinal grooves.

18. The optical scanning device according to claim 17, wherein a pitch Dp of the plurality of longitudinal grooves is set according to Formula 2 given below:

$$Dp = \frac{m\lambda}{\sin(2\alpha_1 + 2\alpha_2 - 180°)} \quad \text{(Formula 2)}$$

wherein, in Formula 2, m denotes a natural number, $\lambda$ denotes a wavelength of original light La, and α1 and ═2 denote tilt angles of a pair of inclined surfaces of one of the longitudinal grooves with respect to a flat reflection surface of the flat reflection part.

\* \* \* \* \*